United States Patent [19]
Sommerfeld et al.

[11] Patent Number: 5,985,998
[45] Date of Patent: Nov. 16, 1999

[54] SOLVENT DISPERSIBLE INTERPENETRATING POLYMER NETWORKS

[75] Inventors: Eugene G. Sommerfeld, Danvers, Mass.; Frank Schadt, III, Wilmington, Del.

[73] Assignee: E. I. du Pont de Nemours and Company, Wilmington, Del.

[21] Appl. No.: 09/248,565

[22] Filed: Feb. 11, 1999

Related U.S. Application Data

[62] Division of application No. 08/043,620, Apr. 7, 1993, Pat. No. 5,886,101, which is a continuation of application No. 07/662,539, Feb. 28, 1991, abandoned, which is a continuation-in-part of application No. 07/414,417, Sep. 29, 1989, abandoned, which is a continuation-in-part of application No. 07/162,966, Mar. 2, 1988, abandoned.

[51] Int. Cl.$^6$ ............... C08L 35/00; C08L 39/04
[52] U.S. Cl. ............... 525/72; 525/73; 525/74; 525/78
[58] Field of Search .............. 525/72, 73, 74, 525/78

[56] References Cited

U.S. PATENT DOCUMENTS

| | | |
|---|---|---|
| 4,128,600 | 12/1978 | Skinner . |
| 4,235,972 | 11/1980 | Jones . |
| 4,250,074 | 2/1981 | Foscante . |
| 4,340,389 | 7/1982 | Nonn et al. . |
| 4,361,676 | 11/1982 | Simpson . |
| 4,377,661 | 3/1983 | Wright . |
| 4,396,476 | 8/1983 | Roemer . |
| 4,686,260 | 8/1987 | Lindemann . |
| 4,726,877 | 2/1988 | Fryd et al. . |
| 4,753,865 | 6/1988 | Fryd et al. . |
| 4,777,207 | 10/1988 | Redman . |
| 4,923,934 | 5/1990 | Werner . |
| 4,945,125 | 7/1990 | Dillon et al. . |
| 4,970,263 | 11/1990 | Arkles . |
| 5,006,593 | 4/1991 | Brasure et al. . |
| 5,061,602 | 10/1991 | Koch et al. . |

FOREIGN PATENT DOCUMENTS

| | | |
|---|---|---|
| 0039439 | 1/1980 | European Pat. Off. . |
| 0095627 | 5/1983 | European Pat. Off. . |
| 0137603 | 7/1984 | European Pat. Off. . |
| 0230936 | 1/1987 | European Pat. Off. . |
| 280979 | 9/1988 | European Pat. Off. . |

OTHER PUBLICATIONS

L. H. Sperling, Interpenetrating Polymer Networks and Related Materials, *Plenum Press, N.Y., US*, 75 and 76, 3–5, 1981.
L. H. Sperling, Multicomponent Polymer Materials, *ACS Adv. in Chem.*, 211, 21–56, 1986.
L. H. Sperling, *Comprehensive Polymer Science*, 6, 423–436, 1989.
Kawakami, *Encyclopedia of Polymer Science and Engineering*, 9, 195–204, 9.
Cohen et al., Imaging Processes and Materials, *Neblett's Eighth Edition, Sturge et al.*, Chapter 7, 226–261, 1989.

*Primary Examiner*—Christopher Henderson

[57] ABSTRACT

A novel class of interpenetrating polymer networks which are dispersible in conventional coating solvents is disclosed. Such dispersions are useful in preparing protective and/or decorative film coatings and are particularly useful in photosensitive or imaging formulations such as photoresists, solder masks and the like. These polymer networks are comprised of at least two interpenetrating crosslinked polymers. At least one of the polymer networks is formed by polymerization in a solvent. In one embodiment of this invention, at least one polymer network is prepared from macromers to produce a polymer system having functionalized branch or graft linear segments. The solvent dispersible interpenetrating networks of this invention are particularly useful as binders in addition polymerizable photosensitive compositions containing crosslinking monomers such as solder masks. Upon exposure to actinic radiation and suitable thermal curing, solder mask coatings of such photosensitive compositions form multiple, e.g., triple, interpenetrating polymer networks having superior toughness and flexibility.

8 Claims, No Drawings

SOLVENT DISPERSIBLE INTERPENETRATING POLYMER NETWORKS

CROSS REFERENCE TO RELATED APPLICATIONS

This is a division of application Ser. No. 08/043,620 filed Apr. 7, 1993, now U.S. Pat. No. 5,886,101 which is a continuation of Ser. No. 07/662,539 filed Feb. 28, 1991, now abandoned, which is a continuation-in-part of Ser. No. 07/414,417 filed Sep. 29, 1989, now abandoned, which is a continuation-in-part of Ser. No. 07/162,966 filed Mar. 2, 1988, now abandoned.

BACKGROUND OF THE INVENTION

The present invention is directed to a novel composition of matter which is a type of interpenetrating polymer network. The present invention also relates to liquid and solid imaging compositions containing such polymer products and including the use of such compositions as photoresists and solder masks.

Interpenetrating polymer network (also known as IPN) systems are finding increasing uses in polymer product development. Such interpenetrating polymer network systems and developments are described by L. H. Sperling in "Interpenetrating Polymer Networks and Related Materials", Plenum Press, New York, 1981, in pages 21–56 of "Multicomponent Polymer Materials" ACS Adv. in Chem. No. 211, Edited by D. R. Paul and L. H. Sperling, ACS Books, Washington, D.C., 1986, and in pages 423–436 of "Comprehensive Polymer Science", Volume 6, "Polymer Reactions", Edited by G. C. Eastmond, A. Ledwith, S. Russo, and P. Sigwalt, Pergamon Press, Elmsford, N.Y., 1989. Interpenetrating polymer networks are defined in such publications as a polymer system comprising two or more constituent polymer networks that are polymerized and/or crosslinked in the immediate presence of one another. In effect, such a polymeric system comprises two or more network polymers that interpenetrate each other to some extent and which are not chemically bound but which are con-catenated such that they can not be separated unless chemical bonds are broken. Each constituent polymer network is characterized as an extensive three-dimensional polymer structure in which most chains are crosslinked at least twice to other chains so that the network structure has dimensions comparable with those of the macroscopic material. The constituent networks may be catenated, i.e., physically interlocked, and may also be subsequently chemically linked together to a limited extent. While the above definition describes an ideal structure, it is recognized that phase separation may limit actual molecular interpenetration. Thus the material sometimes may be described as having "interpenetrating phases" and/or "interpenetrating networks". If the synthesis or crosslinking of two or more of the constituent components is concurrent, the system may be designated a simultaneous interpenetrating network. If on the other hand, the synthesis and/or crosslinking are carried out separately, the system may be designated a sequential interpenetrating network.

A polymer system comprising two or more constituent polymers in intimate contact, wherein at least one is crosslinked and at least one other is linear is designated a semi-interpenetrating polymer network.

This type of polymer system is considered to be formed in cured photopolymerizable systems such as disclosed in Chapter 7 of "Imaging Processes and Materials-Neblette's Eighth Edition", Edited by J. M. Sturge, V. Walworth & A. Shepp, Van Nostrand Reinhold, New York, 1989. Such photopolymerizable systems typically have one or more linear polymers as a binding agent and at least one addition polymerizable monomeric component having two or more sites of terminal ethylenic unsaturation. Frequently the binding agent is a simple polymer blend, i.e., an intimate mixture of two or more polymers wherein there is no covalent chemical bonding between the different species of polymer chains. During imaging exposure, the monomeric component polymerizes and crosslinks to form a polymer network in which at least some of the polymeric binding agent is entrapped thereby photohardening or insolubilizing the exposed area.

Organic solvent swellable polymer networks, i.e., microgels, are known and their use in photosensitive compositions, particularly in photopolymerizable resists, is disclosed in U.S. Pat. No. 4,726,877. Microgel is a term originated in the paint industry and it includes crosslinked spherical polymer molecules of high molecular weight such as of the order of $10^9$ to $10^{10}$ with a particle size of 0.05 to 1 micron in diameter prepared by emulsion polymerization. Crosslinking renders these microgels insoluble but capable of swelling in strong solvent without destroying the crosslinked structure. U.S. Pat. No. 4,726,877 also discloses that the polymer components can be varied during polymerization to produce core and shell microgel with different interior and exterior composition. Unlike interpenetrating polymer networks, during preparation of core/shell microgels, the shell typically is grafted to the core network by covalent chemical bonding.

Linear polymers with polymeric arms are known and typically are prepared by copolymerizing a conventional monomer with a macromer. Macromers are defined by Kawakami in the "Encyclopedia of Polymer Science And Engineering", Vol. 9, pp. 195–204 (John Wiley & Sons, New York, 1987) to be polymers of molecular weight ranging from several hundred to tens of thousands, with a functional group at the end that can further polymerize, such as an ethylenic, an epoxy, a dicarboxylic acid, a diol or a diamino group. European Patent Publication No. 280,979 discloses the use of such a polymer as a binding agent in a photopolymerizable material suitable for producing printing forms or resist patterns. The polymer binder disclosed consists of a film-forming copolymer that has a two-phase morphology and an average molecular weight (weight average) of more than 10,000. The copolymer is produced using a macromer with an average molecular weight (weight average) of 1,000 to 100,000.

Although the physical and chemical properties of preformed interpenetrating polymer network systems and semi-interpenetrating polymer network systems are desirable in photosensitive products, the fact that after their formation they are not soluble or dispersible in conventional coating solvents markedly reduces their utility in photosensitive formulations.

There is a need, which is not met by the current technology, to produce polymer binders which have crosslinked or network-like structure for use in coatable and conventionally processable photosensitive systems to produce tough, flexible, adherent or otherwise useful polymer products, and to improve their end-use performance.

SUMMARY OF THE INVENTION

The present invention is directed to a composition of matter comprising at least two polymer networks which (a) are polymerized and/or crosslinked in the immediate presence of one another, and (b) are dispersible in a solvent with the proviso that at least one of the polymer networks is formed by polymerization in solvent and that one of the following takes place in formation of two polymer networks:

(i) the two polymer networks are formed sequentially wherein the second polymer network is formed in a solvent dispersion of the first formed polymer network, or (ii) the two polymer networks are formed simultaneously or substantially simultaneously by independent and non-interfering mechanisms of polymerization.

DETAILED DESCRIPTION OF THE INVENTION

Polymer Product

The present invention is directed to a novel composition of matter or polymer product which is believed to be a new class of an interpenetrating polymer network consistent with the terminology and definitions set forth by L. H. Sperling in pages 423–436 of "Comprehensive Polymer Science", Volume 6, "Polymer Reactions", Edited by G. C. Eastmond, A. Ledwith, S. Russo, and P. Sigwalt, Pergamon Press, Elmsford, N.Y., 1989. Therefore, this publication is incorporated by reference for the terminology employed herein. As employed in the present patent application, non-interfering mechanisms of polymerization is synonymous with non-interfering routes of polymerization as employed in Sperling, p. 423. In the instance when the polymer networks are formed simultaneously or substantially simultaneously by independent and non-interfering mechanisms of polymerization, the mechanisms may have the same or different rates or kinetics of polymerization.

The novel composition of matter differs from the interpenetrating polymer networks of the prior art in that the composition contains at least two polymer networks characterized by the criterion that the polymer network composition is capable of being dispersed in an organic solvent and by a method of preparation of the polymer networks.

The term "network" means a three-dimensional system of polymer chains held together by chemical crosslinks. In the present embodiment of the invention it is required that at least two polymer networks are present. In a preferred mode two networks are present, although three or more can be present in accordance with the direct teachings herein.

For the two polymer networks a necessary criterion is that the networks are polymerized and/or crosslinked in the immediate presence of one another. Thus at least one of the polymer networks is formed by chemical bonds in the presence of a second polymer network. Such polymer network systems may be characterized by an inability to totally, physically separate one network from the other without breaking the integrity of one of the networks. Illustratively, high pressure liquid chromatography (HPLC), Soxhlet extraction, or any other conventional separation processes, such as disclosed in J. M. Widmaier and L. H. Sperling "Macromolecules" 1982, 15, 625–631, cannot totally separate the two networks without breaking or otherwise disrupting chemical bonds. Without being bound to any theory, the two networks are considered to be catenated, i.e., a physical connection of the networks by interlocking some portion of the polymer chains of the individual networks.

A further criterion which is necessary for the two polymer networks is an ability to be dispersible in a solvent, such as organic solvent. Dispersible is used in its conventional sense; the term excludes a latex.

A solvent is used in its conventional sense with examples of organic solvents including liquid alkanes, aromatics, ketones, ethers, alkanolst alkoxyalkanols, halocarbons and the like and mixtures thereof. It is pointed out that the composition of matter need only be dispersible in one of the solvents to meet this criteria. An example of a solvent which can conventionally be employed to determine a property of dispersibility is a solvent for one of the components which serves as a precursor in the formation of one of the networks. While the composition of matter of this invention typically is formed in an organic solvent, the composition of matter formed may be subsequently dispersed in aqueous or semi-aqueous liquids. Examples of aqueous and semiaqueous liquids include water solutions of ammonia, amines, alkanols, alkoxyalkanols, acids, bases and the like.

Conventional interpenetrating polymer networks of the prior art cannot be dispersed or dissolved in such solvents since extensive network formation far beyond the gel point leads to an interpenetrating polymer network which has substantially infinite molecular weight ($M_w$) and which is considered to extend throughout the volume of the polymerized material, i.e., approaching the size of the reaction vessel. Although such networks may be swellable in organic solvent, they remain insoluble and undispersible. The gel point is a well defined stage in polymerization in which the polymerizate transforms suddenly from a viscous liquid to an elastic gel. Prior to the gel point substantially all of the polymer is soluble in suitable solvents and is fusible, but beyond the gel point the polymer is infusible and is no longer totally soluble. Paraphrasing the definition in pages 343–351, "Encyclopedia of Polymer Science and Engineering Supplement", Second Edition, John Wiley & Sons, 1989 (which is incorporated herein by reference)—a polymer at its gel point, the critical gel, is in a transition state between liquid and solid. Its molecular-weight distribution is infinitely broad and molecules range from the smallest unreacted oligomer to the infinite cluster. The molecular motions are correlated over large distances but the critical gel has no intrinsic size scale. The polymer reaches the gel point at a critical extent of the polymerization/crosslinking reaction. The polymer before the gel point is called a sol because it is soluble in good solvents. The polymer beyond the gel point is called a gel, which is not soluble, even in a good solvent. However, low molecular weight molecules (sol fraction) are still extractable.

The composition of matter of this invention, i.e., the polymer product, is dispersible in solvent, and comprises at least two interpenetrating polymer networks, as defined supra, which may include infinite cluster fractions. Such polymer products can contain crosslinked polymer networks wherein polymerization is terminated before, substantially at, or near a gel point. In addition to the crosslinked polymer networks, such polymer products may also contain solvent dispersible oligomers, sols, critical gels or combinations thereof, formed in the polymerization process. In contrast/polymerization and/or crosslinking of networks in previous interpenetrating polymer networks is typically continued far beyond the gel point to form a gel that is not dispersible in conventional solvents or fusible.

Each constituent polymer network which constitutes the composition of matter of the present invention is prepared from two or more solvent soluble monomeric precursors, wherein a small percentage of the monomeric precursors is a crosslinking precursor. This small percentage will vary depending on the degree of crosslinking desired, the nature of the monomeric and crosslinking precursors, and the polymerization kinetics involved. A preferred range is between about 0.3 and about 10% by weight. A particularly preferred range is between about 0.5 and 10%. These polymer networks can be any of those prepared in solution by addition, step-growth or ring-opening polymerization. Illustrative of polymer networks are acrylics; styrenics; phenolics; epoxies; urethane polymers; polyesters, polymers of vinyl halides, vinylidene halides, vinyl esters and vinyl alcohols; polyamides; polyimides; silicones; polycarbonates; polyethers; polyolefins such as polyethylene and polypropylene; diolefin polymers such as polybutadiene and polyisoprene; and poly(arylene sulfides) and poly(arylene sulfones). The polymer chains can be substantially composed of homopolymers or copolymers, but are crosslinked with conventional crosslinking precursors such as, for example, ethylene glycol dimethacrylate or a triisocyanate or some other multifunctional monomer. Typically the crosslinking precursor comprises less than 10 weight % of the precursors used to form the polymer network and even more preferably between 0.5 and 3 weight %.

Preferred addition polymerizable monomer precursors include: methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MAA); acrylic acid (AA); esters of acrylic and methacrylic acids wherein the alcohol group contains from 1 to 18 carbon atoms; nitriles and amides of acrylic and methacrylic acids; glycidyl acrylate and methacrylate; itaconic acid (IA) and itaconic acid anhydride, itaconic acid half ester and itaconic imide; maleic acid and maleic acid anhydride, maleic acid half ester and maleimide; aminoethyl methacrylate; aminoethyl acrylate; t-butyl aminoethyl methacrylate; acrylamide; N-t-octyl acrylamide; vinyl methyl ether; styrene (S); alpha-methyl styrene; vinyl acetate; vinyl chloride; butadiene (B); isoprene (I); vinyl pyrrolidone; and the like.

Preferred addition polymerizable crosslinking precursors include: ethylene glycol dimethacrylate (EGDMA); ethylene glycol diacrylate (EGDA); propylene glycol dimethacrylate; propylene glycol diacrylate; butylene glycol dimethacrylate; butylene glycol diacrylate; hexamethylene glycol dimethacrylate; hexamethylene glycol diacrylate; pentamethylene glycol diacrylate; pentamethylene glycol dimethacrylate; decamethylene glycol diacrylate; decamethylene glycol dimethacrylate; vinyl acrylate; divinyl benzene; glycerol triacrylate; trimethylolpropane triacrylate; pentaerythritol triacrylate; polyoxyethylated trimethylolpropane triacrylate and trimethacrylate and similar compounds as disclosed in U.S. Pat. No. 3,380,831; 2,2-di(p-hydroxyphenyl)-propane diacrylate; pentaerythritol tetraacrylate; 2,2-di-(p-hydroxyphenyl)propane dimethacrylate; triethylene glycol diacrylate; polyoxyethyl-2,2-di-(p-hydroxyphenyl)-propane dimethacrylate; di-(3-methacryloxy-2-hydroxypropyl)ether of bisphenol-A; di-(2-methacryloxyethyl) ether of bisphenol-A; di-(3-acryloxy-2-hydroxypropyl) ether of bisphenol-A; di-(2-acryloxyethyl) ether of bisphenol-A; di-(3-methacryloxy-2-hydroxypropyl) ether of tetrachloro-bisphenol-A; di-(2-methacryloxyethyl) ether of tetrachloro-bisphenol-A; di-(3-methacryloxy-2-hydroxypropyl) ether of tetrabromo-bisphenol-A; di-(2-methacryloxyethyl) ether of tetrabromo-bisphenol-A; di-(3-methacryloxy-2-hydroxypropyl) ether of 1,4-butanediol; di-(3-methacryloxy-2-hydroxypropyl) ether of diphenolic acid; triethylene glycol dimethacrylate; polyoxypropyl one trimethylol propane triacrylate (462); 1,2,4-butanetriol trimethacrylate; 2,2,4-trimethyl-1,3-pentanediol dimethacrylate; pentaerythritol trimethacrylate; 1-phenyl ethylene-1,2-dimethacrylate; pentaerythritol tetramethacrylate; trimethylol propane trimethacrylate; 1,5-pentanediol dimethacrylate; diallyl fumarate; 1,4-benzenediol dimethacrylate; 1,4-diisopropenyl benzene; and 1,3,5-triisopropenyl benzene. A class of addition polymerizable crosslinking precursors are an alkylene or a polyalkylene glycol diacrylate or dimethacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Members of this class are those wherein at least one and preferably most of such linkages are conjugated with a double bonded carbon, including carbon double bonded to carbon and to such heteroatoms as nitrogen, oxygen and sulfur. Also included are such materials wherein the ethylenically unsaturated groups, especially the vinylidene groups, are conjugated with ester or amide structures and the like.

During conventional polymerization of monomer/binder systems, such as in photoresist formulations as described supra, in which the monomer typically plasticizes the polymeric binder, the newly formed polymeric material is believed to separate from the monomer/binder to form distinct microdomains. During the formation of the product of this invention, the tendency to phase separate persists but is significantly retarded due to the interpenetrating network formation which is hypothesized to interlock at least a portion of one of the constituent networks into a portion of the other network. Thus the product of this invention may consist of a single homogeneous domain where no separation occurs, two domains where one network is completely encompassed in a portion of a second network, or multiple domains where each network is encompassed only in a portion of the other. The actual number of domains may be determined, in some instances, by electron microscopy, and the mixing of networks from the measured glass transition temperatures of the polymer product of this invention.

In one embodiment of this invention, the composition of matter contains at least one polymer network having at least 0.5% by weight of branch or graft linear segments. The branch or graft linear segments, also known as polymer arms, typically are uniformly distributed throughout the polymer network. The "polymer arm" is a polymer or oligomer of at least two monomer units, which is attached to the network polymer by a covalent bond. Typically, the polymer arm is incorporated into the polymer network as a macromer precursor during the polymerization process. A "macromer" is a polymer or copolymer of molecular weight ranging from several hundred to tens of thousands with a functional group at the end that can further polymerize, such as an ethylenic, an epoxy, a dicarboxylic acid, a diol or a diamino group. Preferably the macromer is a linear polymer or copolymer end capped with an ethylenic group. Typically, a polymer network bearing one or more polymer arms is characterized in that between about 0.5 and 80 weight % of the monomeric precursors used in the polymerization process is a macromer. But, for the purposes of this invention, the term "macromer precursor" is intended to include polymer arms bonded to the polymer network after network formation is complete.

Although such polymer networks bearing polymer arms are used herein as an intermediate to form the composition of matter of this invention, such unique networks may be used as the sole polymer network or as a simple polymer mixture in a formulated polymer products. Such a polymer network is a composition of matter comprising a polymer network containing at least 0.5% by weight of branch or graft linear polymer segments, wherein the polymer network is dispersible in a solvent and wherein the polymeric network is formed by polymerization in a solvent. It is preferred that the branch or graft linear polymer segments are formed during formation of the polymer network from at least one macromer, linear polymer precursor having a terminal polymerizable group.

At least one network constituent of the composition of matter of this invention may contain at least one type of polymer arm, but two or more or all polymeric constituents may likewise bear polymer arms. The polymer arms attached to the polymer network constituent can be any of those derived from macromers disclosed in the "Encyclopedia Of Polymer Science And Engineering", Vol. 9, pp. 195–204 (John Wiley & Sons 1987), or prepared according to the general descriptions in U.S. Pat. No. 4,680,352 U.S. Pat. No. 4,694,054 and U.S. Pat. No. 4,722,984. Illustrative polymer arms are composed of vinyl polymers, acrylic polymers and copolymers of acrylic monomers and vinyl monomers. Preferred addition polymerizable monomer precursors include: methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MAA); acrylic acid (AA); esters of acrylic and methacrylic acids wherein the alcohol group contains from 1 to 18 carbon atoms; nitriles and amides of acrylic and methacrylic acids; glycidyl acrylate and methacrylate; itaconic acid (IA) and itaconic acid anhydride, itaconic acid half ester and itaconic imide; maleic acid and maleic acid anhydride, maleic acid half ester and maleimide; aminoethyl methacrylate; aminoethyl acrylate; t-butyl aminoethyl methacrylate; acrylamide; N-t-octyl acrylamide; vinyl methyl ether; styrene (S); alpha-methyl styrene; vinyl acetate; vinyl chloride; butadiene (B); isoprene (I); vinyl pyrrolidone; and the like. Although the molecular weight of macromers may range from about one hundred fifty to tens of thousands, macromers useful in this invention typically will have limited molecular weight and polydispersity. Typically the linear polymer segment, i.e., the macromer, will contain between 2 and 1000 monomeric units and preferably between 4 and 100 monomeric units. Preferably the macromer will have a weight average molecular weight ($M_W$) of about 150 to 100,000; a number average molecular weight ($M_n$) of about 150 to 20,000 and a polydispersity ($M_W/Mr$) of about 5 or less. Still more preferably the macromer, or the resulting linear polymer segment, will have a weight average molecular weight ($M_W$) of about 250 to 10,000. Particularly preferred are macromers having a $M_W$ of about 5,000 or less and a polydispersity of about 3 or less. The lower molecular weight limit of the macromer will be equivalent to the molecular weight of two, three or four monomer units used to form the macromer. Typically the macromer precursor comprises between about 0.5 and about 80 weight % of the precursors used to prepare the limited polymer network and preferably between about 5 and about 50 weight %.

An additional embodiment of this invention is a composition of matter comprising at least one polymer network and a linear or branched polymer which are dispersible in a solvent with the proviso that the polymer network is formed by polymerization in a solvent and that one of the following takes place in formation of the polymer network and the linear or branched polymer:

(i) the polymer network and the linear or branched polymer are formed sequentially wherein, in either order, the polymer network (or the linear or branched polymer) is formed in a solvent solution or dispersion of the first formed linear or branched polymer (or the polymer network), or (ii) the polymer network and the linear or branched polymer are formed simultaneously or substantially simultaneously by independent and non-interfering mechanisms of polymerization.

Each of the constituent polymer networks, linear or branched polymer, or polymer arms of the composition of matter of this invention may contain one or more functional groups. A "functional group" is considered to be any moiety capable of being attached to a polymer or polymer network by a direct valence bond or by a linking group. Illustrative of functional groups which can be borne by the constituent polymer or polymer network are —COOR; —OR; —SR (where R can be hydrogen, alkyl or cycloalkyl of 1–18 carbon atoms, aryl, alkaryl or aralkyl, a heterocyclic, or —$OR_1$ where $R_1$ can be alkyl of 1–18 carbon atoms, aryl, alkaryl or aralkyl); —CN; halogen;

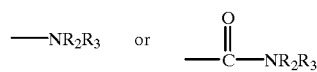

(where $R_2$ and $R_3$ can be hydrogen, alkyl or cycloalkyl of 1–18 carbon atoms, aryl, alkaryl, aralkyl, —$CH_2OR_4$ (where $R_4$ is hydrogen, alkyl or cycloalkyl of 1–18 carbon atoms, aryl, alkaryl, aralkyl), or together $R_2$ and $R_3$ can form a heterocyclic ring);

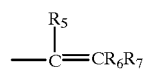

(where $R_5$, $R_6$ and $R_7$ can be hydrogen, alkyl or cycloalkyl of 1–18 carbon atoms, aryl, alkaryl, aralkyl,

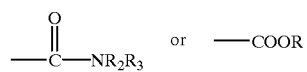

or when taken together $R_5$, $R_6$ and/or $R_7$ can form a cyclic or heterocyclic group); —$SO_3H$; a urethane group; an isocyanate or blocked isocyanate group; a urea group; an oxirane group; an aziridine group; a quinone diazide group; an azo group; an azide group; a diazonium group; an acetylacetoxy group; —$SiR_8R_9R_{10}$ (where $R_8$; $R_9$ and $R_{10}$ can be alkyl or cycloalkyl of 1–18 carbon atoms or —$OR_{11}$ where $R_{11}$ is alkyl or cycloalkyl of 1–18 carbon atoms, aryl, alkaryl or aralkyl); or an —$OSO_3R_{12}$, —$OPO_2R_{12}$, —$PO_2R_{12}$, —$PR_{12}R_{13}R_{14}$, —$OPOR_{12}$, —$SR_{12}R_{13}$, or —$N^+R_{12}R_{13}R_{14}$ group (where $R_{12}$, $R_{13}$ and $R_{14}$ can be hydrogen, alkyl or cycloalkyl of 1–18 carbon atoms, aryl, alkaryl or aralkyl); or a salt or onium salt of any of the foregoing. Preferred functional groups are —COOH, —OH, —$NH_2$, an amide group, a vinyl group, a urethane group, an isocyanate group, a blocked isocyanate group or combinations thereof.

The product of this invention may be made by incorporating just sufficient crosslinking precursor so that polymerization terminates before or near, i.e., substantially at, the gel point.

The product of this invention may be made from any of the forgoing polymeric precursors matched with any other (s), or with itself, provided the following conditions are met:

1. The respective polymerizations must be capable of occurring sequentially or simultaneously without interfering with each other; and
2. Solutions of precursors of the respective constituent polymer network must be compatible with one another, or monomer precursors used to make one polymer network must be able to swell the polymer network of the other.

The composition of matter of the invention may be prepared by polymerizing one set of monomers and/or oligomers (to form polymer network B) into an already formed polymer network A.

Network A is first prepared, in an organic liquid which is a solvent for both polymer A chains and polymer B chains, by conventionally polymerizing the desired monomers and oligomers in contact with a suitable initiator and crosslinking agent. Polymerization is continued until the resulting polymer network has a weight average molecular weight ($M_w$) of about 15,000 or more such as 30,000 by gel permeation chromatography (GPC) and is crosslinked with about 0.3 to about 10% by weight of total monomers of a polyfunctional crosslinking agent. It is generally preferable that maximum network formation short of extensive macrogelation be obtained during this stage. Alternatively, network A may be a preformed microgel provided it is dispersible and swellable in the organic solvent for the precursors needed to form polymer network B.

Monomer set B, together with about 0.3 to about 10% of a crosslinking agent and an initiator or catalyst, is then added to the liquid containing network A and polymerized until the weight average molecular weight ($M_w$) of the polymer network B is about 15,000 or more such as 30,000 as determined by GPC. This second polymerization is carried out so that monomers or oligomers of set B do not form graft copolymers with polymer network A.

Times, temperatures, pressures and initiators or catalysts are conventional for the monomers chosen, and polymerizations are carried out so that the resulting dispersion will generally contain less than about 75% solids (total polymers).

An additional embodiment of this invention is a composition of matter comprising at least three polymer components wherein at least two of the polymer components are polymer networks which are polymerized and/or crosslinked in the immediate presence of one another, and wherein at least two of the polymer networks are dispersible in a solvent with the proviso that at least one of the solvent dispersible polymer networks is formed by polymerization in a solvent and that one of the following takes place in formation of the two solvent dispersible polymer networks:

(i) the two polymer networks are formed sequentially wherein the second polymer network is formed in a solvent dispersion of the first formed polymer network, or (ii) the two polymer networks are formed simultaneously or substantially simultaneously by independent and non-interfering mechanisms of polymerization; and wherein the remaining polymer component(s) is formed subsequent to the formation of the two solvent dispersible polymer networks. The remaining polymer components) may be a linear or branched polymer, a solvent dispersible polymer network of this invention or a polymer or polymer network not capable of being solvent dispersed. In this embodiment, the two solvent dispersible polymer networks are prepared first as described previously, then the remaining polymer component(s) is prepared by any process including conventional processes for forming linear, branched or network polymers as well as the process of forming the polymer networks of this invention as described previously. In the instance when the third polymer component is a polymer network, a triple or multiple interpenetrating polymer network is formed. As will be described in detail subsequently, a preferred process for forming this unique class of triple or multiple interpenetrating polymer networks is by incorporating a solvent dispersible two-polymer network product of this invention into a photopolymerizable system containing crosslinking monomers, such as a solder mask formulation, and exposing it to actinic radiation.

Polymer Dispersions

In yet an additional embodiment of this invention a stable solvent dispersion of the composition of matter of this invention is formed. Specifically, the instant invention provides a dispersion, in an organic liquid, of a polymer system comprising at least two normally incompatible polymer networks which are compatibilized by, and whose dispersion is stabilized by, the networks being catenated. More specifically, this invention provides a dispersion, in an organic liquid, of a polymer system comprising at least two normally incompatible polymer networks, each held together by chemical crosslinks, which are compatibilized by, and whose dispersion is stabilized by, the networks being catenated, in which the polymer networks are composed of acrylics; epoxies; urethane polymers; polyesters; polymers of vinyl halides, vinylidene halides, vinyl esters or vinyl alcohols; polyamides; polyimides; polycarbonates; polyethers; polyolefins; or diolefin polymers. In the following description of this embodiment alternate terminology will be used which is consistent with the description of of the composition of matter of this invention presented above.

The present invention further provides a process for the preparation of the above dispersions comprising (a) preparing a polymer network in an organic liquid by polymerizing a set of monomers in contact with a suitable crosslinking agent; and then (b) adding one or more sets of monomers, together with a suitable crosslinking agent(s), to the product of (a) and polymerizing these monomers into the network produced in (a);

the organic liquid being a common solvent for the polymer chains produced in (a) and (b), and the polymerization conditions in (b) being such that the monomers do not form graft copolymers with the polymer network produced in (a).

In the past, attempts to prepare blends of two or more incompatible polymers in a compatible organic liquid have given dispersions which are unstable in the sense that they separate into two layers or phases on standing unless they have been stabilized by a sufficient quantity of a block copolymer or graft copolymer.

The dispersions of the present invention, in contrast, are stable not only in the sense that their dispersed phases do not separate on standing, but also in the sense that these phases keep their homogeneity over long periods. All this is accomplished without the use of extrinsic stabilizers.

This stability is due to the presence in the dispersed phases of catenated networks of the constituent polymers. The catenation not only stabilizes the dispersions but in many cases also gives, in products derived from these dispersions, properties superior to those of the prior art.

A dispersion of the invention is composed of a dispersed phase in an organic liquid. This dispersed phase, in turn, is composed of at least two normally incompatible polymer networks which are compatibilized by, and whose dispersions are stabilized by, the networks being catenated.

By "network" is meant a three-dimensional system of polymer chains held together by chemical crosslinks.

"Catenated", as it is used herein, means the connection of the networks by the interlocking of some portion of those networks so that physical separation, as determined by high pressure liquid chromatography (HPLC), is not possible without breaking or otherwise disrupting the interlocks. No actual chemical bonds need exist between the atoms of one network and those of another.

"Compatibility" is used herein in the conventional sense of meaning the property of two or more polymers to remain in intimate contact on a microscopic scale.

"Stabilized" is the property shown by a dispersion, in a good solvent for all the constituent polymer chains, when concentrated or diluted to 55% solids, and when held over a period of seven days at 25° C., to keep the statistical homogeneity of the composition of its dispersed phase, within ±10%, as determined from samples withdrawn from any point in the dispersion. Statistical homogeneity is determined from analysis by conventional analytical techniques such as Fourier Transform Infrared Spectroscopy or NMR spectroscopy, with the results analyzed by customary statistical methods. The analysis is performed at 25° C. and is performed on a sample obtained by evaporating the dispersion to dryness.

The dispersions of the invention are in organic liquids. Any organic liquid can be used which is compatible with the system, i.e., one which does not adversely affect the physical or chemical characteristics of the constituent polymer chains or their networks to any significant degree. In the preparation of the dispersions, a liquid should be selected which is a good solvent for all the constituent polymer chains. For diluting the dispersions after they have been prepared, it is necessary that the liquid be a solvent for at least one of the polymer chains.

Illustrative of organic liquid which can be used are aromatic and aliphatic hydrocarbons, ketones, alcohols, ethers, alcohol ethers, esters, chlorinated hydrocarbons and aprotic solvents such as N-methylpyrrolidone, N,N-dimethylacetamide and dimethylsulfoxide. Mixtures can also be used.

The polymer networks which constitute the catenated systems can be any of those prepared by addition, step-growth or ring-opening polymerization. Illustrative are acrylics such as acrylate or methacrylate polymers; epoxies; urethane polymers; polyesters; polymers of vinyl halides, vinylidene halides, vinyl esters and vinyl alcohols; polyamides; polyimides; silicone polymers; polycarbonates; polyethers; polyolefins such as polyethylene and polypropylene; diolefin polymers such as polybutadiene and polyisoprene; poly(arylene sulfides) and poly(arylene sulfones). The polymer chains can be composed of homopolymers or copolymers, and are crosslinked with conventional crosslinking agents such as, for example, ethylene glycol dimethacrylate or a triisocyanate. Preferred are the acrylates, methacrylates, epoxies, urethane polymers and polyesters.

A catenated system can be made from any one of the foregoing matched with any other(s), or with itself, provided that the following conditions are met:

1. The respective preparative polymerizations must be capable of occurring sequentially or concurrently without interfering with each other.
2. The respective constituent polymer chains of the catenated systems must be incompatible with one another in the absence of catenation.
3. Solutions of monomers and oligomers of the respective constituent polymer chains must be compatible with one another; or monomers used to make one polymer network must be able to swell the polymer network of the other.

Illustrative of polymer networks which can be used to make dispersions of the invention are:

1. S/BA/EGDMA/HEMA-MMA/EGDMA/HEMA
2. S/BA/EGDMA/AA-MMA/EGDMA/MAA
3. S/BA/EGDMA/MAA-MMA/EGDMA/MAA
4. S/EA/EGDMA/HEMA-MMA/EGDMA/MAA
5. S/BA/HEMA/DEAEM/EGDMA-VP/HEMA/EGDMA
6. PEU network-Acrylic network
7. PE network-Acrylic network
8. PEU network-PVAc network
9. PEU network-PVP network
10. Epon/S/EA/MAA-S/Unsaturated PE In the foregoing, the symbols have the following meanings:

EGDMA=ethylene glycol dimethacrylate
MM=methyl methacrylate
S=styrene
BA=butyl acrylate
EA=ethyl acrylate
HEMA=hydroxyethyl methacrylate
AA=acrylic acid
MAA=methacrylic acid
PEU-polyester urethane polymer
PE=polyester
DEAM=diethylaminoethyl methacrylate
VP-vinyl pyridine
Acrylic=polymer or copolymer of an acid, amide, ester or nitrile of acrylic or methacrylic acid
PVAc=poly(vinyl acetate)
PVP=poly(vinyl pyrrolidone)
Epon=condensation product of bisphenol-A and epichlorohydrin
/=dividing point between one monomer in a polymer network and the others
-=dividing point between one constituent polymer network and the other(s)

The systems preferred for use in the dispersions of the invention are numbered 1–7 in the foregoing list.

The dispersions of the invention can be prepared by polymerizing one set of monomers and/or oligomers (to form polymer network A) into an already formed polymer network B. a sequential operation. They may also be formed by concurrently polymerizing sets of monomers (one set to form polymer network A and the other to form polymer network B) into one another. Both methods are performed in solution. The sequential method is preferred.

In the sequential method, a network of polymer B is first prepared, in an organic liquid which is a good solvent for both polymer A chains and polymer B chains, by conventionally polymerizing the desired monomers and/or oligomers in contact with a suitable crosslinking agent. Polymerization is continued until the resulting polymer network has a molecular weight $M_W$ of about 30,000 or more (by GPC) and is crosslinked with 0.5–10% by weight of total monomers of a polyfunctional crosslinking agent. It is preferable that maximum network formation short of macrogelation be obtained during this stage.

Monomer set A, together with about from 0.5–10% of a crosslinking agent and an initiator or catalyst, is then added to the liquid and polymerized until the molecular weight $M_W$ of polymer network A is about 30,000 or more by GPC, to form a dispersion of the invention. This second polymerization is carried out so that monomers or oligomers of set A do not form graft copolymers with polymer network B.

Times, temperatures and pressures are conventional for the monomers chosen, and the polymerizations are carried out so that the resulting dispersion will contain about 40–60% solids (total polymers).

In the concurrent method, the monomers and/or oligomers of Set A and the monomers, oligomers and polymers of Set B and appropriate crosslinking agents for each set are dissolved in a common organic liquid. The sets are then polymerized simultaneously, but the types of polymerization must be diverse and non-interfering. For example, one could be a free-radical polymerization and the other, a condensation polymerization. The polymerizations are conducted conventionally, but conditions and initiators or catalysts must be selected so that the respective rates of polymerization are approximately the same and in some instances different. As in the sequential method, polymerizations are continued until each polymer network has a molecular weight $M_W$ of about 30,000 or more by GPC and is crosslinked with about 0.5–10% by weight of total monomers of a polyfunctional crosslinking agent. The resulting dispersions have solids contents of about 40–60% (total catenated polymer system).

The dispersions of the invention can be used, with or without pigments, to make coatings for industrial, cosmetic and automotive purposes. They are especially useful for applying mar-resistant finishes to automobile and truck parts, for coating plastic automobile parts and as pigment dispersants. The dispersions are also useful as nail coating compositions such as polish or enamel for fingernails or toenails or other such cellular substrates having keratin as the primary proteinacious constituent. The nail coating composition comprises an organic solvent, e.g., toluene, ethanol, ethyl acetate, butyl acetate, and combinations thereof, having dispersed or dissolved therein a polymer product of this invention. The nail coating composition may also have dispersed or dissolved therein a pigment or colorant. The nail coating composition is typically applied as a dispersion or solution to the fingernail or toenail substrate surface and dried to form a protective and/or decorative coating thereon. The dried nail coating typically is removeable with conventional solvents to allow for ease of replacement or repair.

The residues from removal of the organic liquids from the dispersions, i.e., the composition of matter of this invention, can be used to make films useful as semi-permeable membranes for the purification of water and for use in electrolytic cells, as mar-resistant tough films for structural automobile parts and building panels, as mold release films, as adhesive films, e.g., for the manufacture of multilayer printed circuits, as photoresists and as solder masks and for the formation of curved panels of various plastic materials in aircraft and automobile production. The residues can also be extruded or molded into various useful shapes, can be used as elastomers, can be used in the fabrication of gaskets, hoses, belts and bushings, and as adhesives.

Superior toughness-flexibility balance and solvent resistance can be built into the residues by further crosslinking one or more of the constituent polymer networks with such external crosslinking agents as epoxies, isocyanates and aminoplast resins.

Sensitive Compositions

The polymer products, i.e., compositions of matter and dispersions, of this invention are particularly useful in sensitive compositions and in particular in photosensitive compositions such as photoresists, solder masks, and the like, which will be further described to illustrate this invention.

A sensitive composition of this invention comprises:
(a) a composition of matter of this invention, and
(b) at least one photoactive or thermally active component.

"Photoactive", which is synonymous with "photosensitive", describes a material which changes its chemical or physical nature, or causes such a change, upon exposure to actinic radiation, in such a way that the change is formed directly, e.g., an image, or that a precursor, e.g., a latent image, is formed which upon further treatment produces the desired change. "Thermally active" describes a material which changes its chemical or physical nature, or causes such a change, when its temperature is raised or lowered or when a substance is added or removed. Illustrative of such a photoactive or thermally active component is a material which cyclizes, dimerizes, polymerizes, crosslinks, generates a free radical, generates an ionic species, generates an uncharged or a neutral species, or dissociates upon exposure to actinic radiation or when it is heated. Photoactive or photosensitive component includes a photoinitiator, a photosensitizer or a combination thereof; a photosolubilizer; a photocatalytic; a photodesensitizer; a photoinhibitor; a phototackifier; a photodetackifier; or a component which is photodegradable; photochromic; photoreducible; photooxidizable; photoadhesive; photoreleaseable; photomagnetic; photodemagnetic; photoconductive or photoinsulative; or is a material which changes or causes changes in refractive index upon exposure to actinic radiation. The sensitive compositions of this invention include those instances in which component (b) is bonded to component (a); or in which component (b) comprises:
(i) a polymerizable monomer, and
(ii) an initiating system activatable by actinic radiation.

The polymer products of this invention are useful as components of photosensitive systems and particularly in photoimaging systems such as those described in "Light-Sensitive Systems: Chemistry and Application of Nonsilver Halide Photographic Processes" by J. Kosar, John Wiley & Sons, Inc., 1965 and more recently in "Imaging Processes And Materials-Neblette's Eighth Edition" Edited by J. Sturge, V. Walworth and A. Shepp, Van Nostrand Reinhold, 1989. In such systems, actinic radiation impinges on a material containing a photoactive component to induce a physical or chemical change in that material. A useful image or latent image which can be processed into a useful image can thereby produced. Typically actinic radiation useful for imaging is light ranging from the near ultraviolet through the visible spectral regions, but in some instances may also include infrared, deep-ultraviolet, X-ray and electron beam radiation.

Although the polymer product itself may be photoactive, generally a photosensitive composition contains one or more photoactive components in addition to the polymer product. Upon exposure to actinic radiation, the photoactive component acts to change the rheological state, the solubility, the surface characteristics, refractive index, the color, the electromagnetic characteristics, or other physical or chemical characteristics of the photosensitive composition, such as described in the Neblette's publication supra.

Typically the photosensitive compositions of this invention are used in the form of a supported film or layer although unsupported solid objects may also be prepared.

The photosensitive composition is applied to a suitable substrate to form a continuous film or layer thereon which is imagewise exposed to actinic radiation to form an image directly or latent image. Alternatively, the layer may be uniformly exposed to actinic radiation to cure or harden the layer when the photosensitive composition is applied either in the form of a continuous or patterned layer such as a protective finish, a paint or ink. Any conventional source of actinic radiation may be used including arc, discharge, and incandescent lamps as well as lasers, X-ray and electron beam units. The layer may be applied as a neat, solvent-free, photosensitive liquid or as a dispersion or solution and dried to a solid layer wherein any conventional coating or printing process may be used. Alternatively, the layer or film may be applied by laminating a supported or unsupported solid photosensitive layer to the substrate and then optionally removing the support.

Applications requiring no additional processing steps after exposure to actinic radiation, include those where an image is formed directly, e.g., photopolymer holograms as disclosed in Haugh U.S. Pat. No. 3,658,526 wherein the refractive index changes upon exposure to actinic radiation, diffusion resists as in Gervay and Walker U.S. Pat. No. 3,718,473, color forming systems as in Cescon and Dessauer U.S. Pat. No. 3,445,234 or other photochromic systems. Color forming systems based on photooxidizable or photoreducible agents are disclosed in MacLachlan U.S. Pat. No. 3,390,996. Also included are those applications where decorative or protective coatings are applied and photocured or where a patterned layer is applied and photocured, e.g., a photoresist screen printing ink as in Lipson et al. U.S. Pat. No. 4,003,877.

In those instances when a latent image is formed, the exposed or unexposed areas of the layer containing the latent image may be then modified by removing exposed or unexposed areas, depositing a material on or in the exposed or unexposed areas or further treating the layer to develop an imaged layer. Exposed or unexposed areas of the layer may be removed to form either a deep relief image or a thin stencil image with solvent or aqueous alkaline developers therefor or they may be peeled from the complimentary unexposed or exposed areas adhered to the substrate. A deep relief image in which the sides of the relief are tapered and do not extend to the substrate, typically is used as a letterpress or flexographic printing plate, e.g., as disclosed in Plambeck U.S. Pat. No. 2,760,863 and Brennen and Chen U.S. Pat. No. 4,323,637. A stencil image, in contrast, is a thin relief having vertical side walls down to the substrate thereby forming complimentary uncovered substrate surface areas. A stencil image has numerous applications, e.g., as a resist as disclosed in Celeste U.S. Pat. No. 3,469,982, as a lithographic printing plate as in Alles U.S. Pat. No. 3,458, 311, a photopolymer litho film as in Bratt and Cohen U.S. Pat. No. 4,229,517, a peel-apart drafting film as in Colgrove U.S. Pat. No. 3,353,955, or in peel-apart proofing systems as in Cohen and Fan U.S. Pat. No. 4,247,619. When a stencil image is formed and is used as a resist, unprotected substrate areas are formed which may be further modified by etching the unprotected surface areas or depositing a material thereon. The exposed or unexposed areas of the layer containing the latent image may be modified by depositing a material thereon such as a photodetackification process wherein powdered material is adhered to the unexposed areas, e.g., as in the proofing process of Chu and Cohen U.S. Pat. No. 3,649,268, or a phototackification or photoadhesive process where powdered material is adhered to the exposed areas of the layer, e.g., as in the proofing processes of Chu et al., U.S. Pat. No. 4,243,741 and Grossa U.S. Pat. No. 4,604,340. Liquid toners are also used in electrostatic systems to develop latent images in a photoconductive or a photoinsulative process such as disclosed in Riesenfeld et al. U.S. Pat. No. 4,732,831. Photomagnetic and photodemagnetic systems are used to apply dye to fabrics and resists to circuit boards as disclosed in Gorondy U.S. Pat. No. 4,105, 572, Nacci U.S. Pat. No. 4,292,120 and Nacci et al. U.S. Pat. Nos. 4,338,391 and 4,359,516. Photosensitive compositions containing a a latent image may also be developed into an image by treatment with a reagent or by further treatment with actinic radiation or heat. Conventional silver halide or diazotype systems form a latent image upon exposure which is developed into a visible image upon treatment with a developing reagent. In some silver halide direct-writing systems, development to a visible image is accomplished by uniform exposure to actinic radiation. In some reversal imaging processes the treatment step is used to complete the formation of the latent image before or during development. Such systems include photopolymer systems, e.g., as disclosed in Pazos U.S. Pat. No. 4,198,242 or Dueber et al. U.S. Pat. No. 4,477,556, containing a photoinhibitor wherein imaging exposure generates inhibitor in the exposed areas of the layer and a subsequent uniform exposure to actinic radiation, or in some instances uniformly heated, generates a latent image in the complimentary areas free of photogenerated inhibitor. Such reversal systems also include photodesensitizable systems, e.g., as disclosed in Roos U.S. Pat. No. 3,778,270, wherein, in the exposed areas, a component required for image or latent image formation is degraded or desensitized to an inactive form and the component in the unexposed areas is developed into an image or latent image by subsequent treatment with a reagent.

Illustrative of such photosensitive systems are those described in Chapter 7, "Polymer Imaging" by A. B. Cohen and P. Walker in Neblette's supra, pages 226–262, in which photocrosslinking, photodimerization, photocyclization, photosolubilization, and both ionic and free radical photopolymerization, as well as electrostatic photopolymer imaging and solid imaging are discussed. In Chapter 8, "Low Amplification Imaging Systems" by R. Dessauer and C. E. Looney, pages 263–278, imaging systems discussed include color forming free radical, diazo, and vesicular systems, photochromism, phototackification and photodetacification as well as thermal and photothermal systems.

Photopolymerizable Compositions

The polymer products of this invention are particularly useful in photopolymerizable compositions which contains a monomeric material and a photoinitiator system. In such systems the polymer product functions as a dispersible polymeric binder component to impart desired physical and chemical characteristics to the exposed and unexposed photopolymerizable composition. Upon exposure to actinic radiation, the photoinitiator system induces chain propagated polymerization of the monomeric material by either a condensation mechanism or by free radical addition polymerization. While all photopolymerizable mechanisms are contemplated, the compositions and processes of this invention will be described in the context of free radical initiated addition polymerization of monomers having one or more terminal ethylenically unsaturated groups. In this context, the photoinitiator system when exposed to actinic radiation acts as a source of free radicals needed to initiate polymerization of the monomer. The photoinitiator of the system may be activated by a photosensitizer which absorbs actinic radiation which may be outside the absorption spectrum of the initiator itself, to sensitize the addition polymerization in more practical radiation spectral regions such as near ultraviolet, visible light and near infrared. In the narrow sense, the term photoactive component of the compositions of this invention refers to the material which absorbs the actinic radiation, e.g., the photoinitiator or the photosensitizer, but in the broader sense the term photoactive component refers to any or all the essential materials needed for photopolymerization, i.e., the photoinitiating system and the monomer.

Photopolymerizable compositions contain the polymer products of this invention, an initiating system activated by actinic radiation, and at least one nongaseous ethylenically unsaturated compound having a boiling point above 100° C. at normal atmospheric pressure and being capable of forming a high polymer by photoinitiated addition polymerization. Preferred photopolymerizable compositions contain mono or polyfunctional acrylates or methacrylates and particularly preferred are such compositions containing monomers with two, three or more acrylate or methacrylate groups to allow concurrent crosslinking during the photopolymerization process.

Addition Polymerizable Monomers

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyl one trimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred are those wherein at least one and preferably most of such linkages are conjugated with a double bonded carbon, including carbon double bonded to carbon and to such heteroatoms as nitrogen, oxygen and sulfur. Also preferred are such materials wherein the ethylenically unsaturated groups, especially the vinylidene groups, are conjugated with ester or amide structures.

A particularly preferred class of monomers are t-butyl acrylate, cyclohexyl acrylate, hydroxy $C_1$–$C_{10}$-alkyl acrylate, butanediol diacrylate, hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

Photoinitiator Systems

The photoinitiator system has one or more compounds that directly furnish free-radicals when activated by actinic radiation. The system also may contain a sensitizer that is activated by the actinic radiation, causing the compound to furnish the free-radicals. Useful photoinitiator systems typically will contain a sensitizer that extends spectral response into the near ultraviolet, visible, and near infrared spectral regions.

A large number of free-radical generating compounds, including redox systems such as Rose Bengal/2-dibutylaminethanol, may be selected to advantage. Photoreducible dyes and reducing agents such as those disclosed in U.S. Pat. Nos.: 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos.; 3,427,161; 3,479,185; 3,549,367; 4,311,783; 4,622,286; and 3,784,557 can be used as initiators. Other initiators are dye-borate complexes disclosed in U.S. Pat. No. 4,772,541; and trichloromethyl triazines disclosed in U.S. Pat. Nos. 4,772,534 and 4,774,163. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427–487. Similarly, the cyclohexadienone compounds of U.S. Pat. No. 4,341,860 are useful as initiators.

Preferred photoinitiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al. U.S. Pat. No. 3,652,275, and the arylyidene aryl ketones disclosed in Dueber U.S. Pat. No. 4,162,162. Preferred sensitizers include the following: DBC, i.e., cyclopentanone; 2,5-bis-{[4-(diethylamino)-2-methylphenyl]-methylene}; DEAW, i.e., cyclopentanone, 2,5-bis{[4-

(diethylamino)-phenyl]methylene}; dimethoxy-JDI, i.e., 1H-inden-1-one, 2,3-dihydro-5,6-dimethoxy-2-[(2,3,6,7-tetrahydro-1H,5H-benzo[i,j]-quinolizin-9-yl)methylene]-; and JAW, i.e., cyclopentanone, 2,5-bis[(2,3,6,7-tetrahydro-1H,5H-benzo[i,j]quinolizin-1-yl)methylene]; which have the following structures respectively:

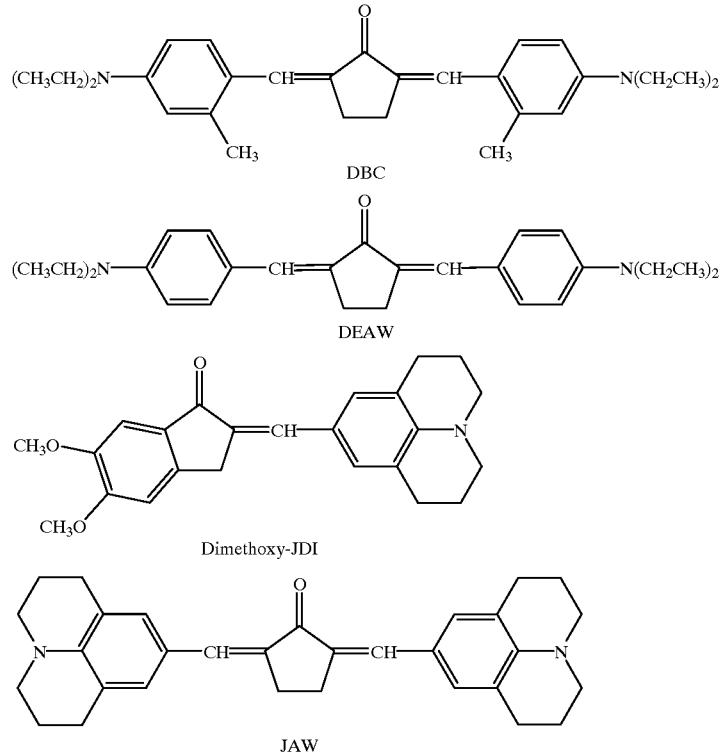

Other particularly useful sensitizers are cyclopentanone, 2,5-bis[2-(1,3-dihydro-1,3,3-trimethyl-2H-indol-2-ylidene) ethylidene], CAS 27713-85-5; and cyclopentanone, 2,5-bis [2-(1-ethylnaphtho[1,2-d]thiazol-2(1H)-ylidene) ethylidene], CAS 27714-25-6.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof. A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

Optional Components

Other compounds conventionally added to photopolymer compositions can also be present to modify the physical properties of the film for a particular use. Such components include: other polymeric binders, fillers, thermal stabilizers, hydrogen donors, thermal crosslinking agents, optical brighteners, ultraviolet radiation materials, colorants such as dyes and pigments, adhesion modifiers, coating aids, and release agents.

Crosslinking Agents

When the photopolymerizable composition is to be used as a permanent coating, such as a solder mask, a chemically or thermally activated crosslinking agent may be incorporated to improve high temperature characteristics, chemical resistance or other mechanical or chemical properties required in the end-use product.

Suitable crosslinking agents include those disclosed in Gervay U.S. Pat. No 4,621,043 and Geissler et al. U.S. Pat. No. 4,438,189, such as melamines, ureas, benzoguanamines and the like.

Examples of suitable crosslinking compounds include: N-methylol compounds of organic carboxamides such as N,N'-dimethylolurea, N,N'-dimethyloloxamide, N,N'-dimethylolmalonamide, N,N'-dimethylolsuccinimide, N,N'-dimethylolsebacamide, N,N',N"-trimethylolcitramide, 1,3-dimethylolimidazolidine-2-one, 1,3-dimethylol-4,5-dihydroxyimidazidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2-one-5-yl]ethane, tetramethylolhydrazine dicarboxamide, N,N'-dimethylolterephthalamide, N,N'-dimethylolbenzene-1,3-disulfonamide and tetramethylolglycoluril; and C-methylol compounds of phenols, phenolethers and aromatic hydrocarbons 2,4,6-trimethylolphenol, 2,6-dimethylol-4-methyloanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

Instead of the aforementioned methylol compounds, it is also possible to use, for example, the corresponding methyl, ethyl or butyl ethers, or esters of acetic acid or propionic acid. Suitable examples include: 4,4'-bismethoxymethyldiphenyl ether, tris-methoxymethyl-diphenyl ether, tetrakis-methoxymethyl hydrazinedicarboxamide, tetrakis-methoxymethylglycoluril, tetrakis-hydroxyethoxymethylglycoluril, bis-acetoxymethyldiphenyl ether, hexamethoxymethyl-melamine. A preferred crosslinking agent of this class is hexamethoxymethyl melamine.

Also useful as crosslinking agents are compounds containing two or more epoxy groups such as the bis-epoxides disclosed in Herwig et al. U.S. Pat. No. 4,485,166. Suitable bis-epoxides include bis-glycidyl ethers of dihydric alcohols and phenols such as bisphenol-A, of polyethylene glycol and polypropylene glycol ethers of bisphenol-A, of butane-1,4-diol, hexane-1,6-diol, polyethylene glycol, propylene glycol or polytetrahydrofuran. Bis-glycidyl ethers of trihydric alcohols, such as glycerol, or of halogenated bisphenol-A, such as tetra-bromo bisphenol-A, can also be used. Preferred crosslinking agents of this class are 2,2-bis-(4-glycidoxy-phenyl)-propane, 2,2-bis-(4-epoxyethoxy-phenyl)-propane, bis-glycidyl ether of tetra-chloro-bisphenol-A, bis-glycidyl ether of tetra-bromo-bisphenol-A, bis-oxiranyl ether of tetra-chloro-bisphenol-A, and bis-oxiranyl ether of tetra-bromo-bisphenol-A.

Also useful as crosslinking agents are blocked polyisocyanates. Upon heating the blocked polyisocyanate, the blocking groups are expected to be split off to yield the free reactive polyisocyanate. Useful polyisocyanates include the following and their trimers, polymers, and polyol adducts: toluene diisocyanate; isophorone diisocyanate; 1,4-naphthalene diisocyanate; 1,6-hexamethylene diisocyanate; 1,10-decamethylene diisocyanate; tetramethyl xylene diisocyanate; bis(4-isocyanatocyclohexyl)methane and the like. Useful blocking groups are derived from oximes, e.g., methyl ethyl ketoxime; caprolactam; diethyl malonate; alcohols; phenols and the like.

Polymeric Modifiers

The photopolymerizable composition may contain other polymeric binders to modify adhesion, flexibility, hardness, oxygen permeability, moisture sensitivity and other mechanical or chemical properties required during its processing or end use. Suitable polymeric binders which can be used in combination with the polymer product of this invention include:

Polyacrylate and alpha-alkyl polyacrylate esters and copolymers, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride polymers and copolymers, e.g., vinylidene chloride/acrylonitrile; vinylidene chloride/methacrylate and vinylidene chloride/vinyl acetate copolymers; polyvinyl chloride and copolymers, e.g., poly(vinyl chloride/vinyl acetate); polyvinyl pyrrolidone and copolymers, e.g., poly(vinyl pyrrolidone/vinyl acetate); saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; polyalkylether glycols having average molecular weights from about 500 to 1,000,000; epoxides, copolyesters, e.g., those prepared from the reaction of at least one polymethylene glycol of the formula $HO(CH_2)_nOH$, where n is a whole number 2 to 10 inclusive, and/or substituted or branched glycols, such as neopentyl glycol, 2-methyl-1,3-propanediol, and trimethyl hexamethylene glycol isomers, and/or polyols with functionality greater than two, such as trimethylol propane, pentaerythritol, and trimethylol ethane, together with one or more of the following acids: hexahydroterephthalic, hexahydroisophthalic, hexahydroorthophthalic, terephthalic, isophthalic, orthophthalic, and alkyl dicarboxylic acid such as succinic, adipic, azelaic, sebacic, and dodecanoic acids, and dimers of $C_{16}$–$C_{18}$ unsaturated fatty acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

In the case where aqueous development of the photosensitive composition is desirable, the polymer product of this invention and other polymeric materials in the photosensitive composition should contain sufficient acidic or other groups to render the composition processable in aqueous developer. Useful aqueous-processable polymeric additives include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For development in an aqueous liquid, such as wholly aqueous solutions containing 1% sodium carbonate by weight, the photosensitive layer will be removed in portions which are not exposed to radiation without substantially adversely affecting the integrity of the exposed areas.

A particularly preferred class of polymeric binder modifiers are polyvinyl pyrrolidone polymers and copolymers, and amphoteric polymers and copolymers.

Plasticizers

The photopolymerizable compositions may also contain a plasticizer to modify adhesion, flexibility, hardness, solubility, and other mechanical or chemical properties required during its processing or end use.

Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, dioctyl phthalate, tributyl phosphate, tricresyl phosphate, tris(2-ethylhexyl) phosphate, Brij® 30 [$C_{12}H_{25}(OCH_2CH_2)_4OH$], and Brij® 35 [$C_{12}H_{25}(OCH_2CH_2)_{20}OH$].

Fillers

The photopolymerizable compositions may also contain particulates such a organic or inorganic fillers to modify the mechanical or chemical properties required during its processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 mil; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystalline thickeners as disclosed in U.S. Pat. No. 3,754,920 such as microcrystalline cellulose and microcrystalline silicas, clays, alumina, bentonite, kalonites, attapultites, and montmorillonites; finely divided powders having a particle size of 5 millimicrons to 50 microns as disclosed in U.S. Pat. No. 3,891,441 such as silicon oxide, titanium oxide, carbon black, zinc oxide, and other commercially available pigments; and the binder-associated, transparent, inorganic particles as disclosed in European Patent Application 87113013.4 such as magnesium silicate (talc), aluminum silicate (clay), calcium carbonate and alumina. Typically, the filler will be transparent to actinic radiation to preclude adverse effects during imaging exposure. Depending on its function in the photopolymerizable composition, the filler may be colloidal or have an average particle size of 50 microns or more in diameter.

Adhesion Promoter

When the photopolymerizable composition is to be used as a coating on a metal surface, such as a photoresist, a heterocyclic or mercaptan compound may be added to improve adhesion of the coating to the metal required during processing or in the end-use product. Suitable adhesion promoters include heterocyclics such as those disclosed in Hurley et al. U.S. Pat. No. 3,622,334, Jones U.S. Pat. No. 3,645,772, and Weed U.S. Pat. No. 4,710,262. Examples of useful adhesion promoters include benzotriazole, 5-chlorobenzotriazole, 1-chlorobenzotriazole, 1-carboxybenzotriazole, 1-hydroxybenzotriazole, 1,2-napthotriazole, benzimidazole, mercapto-benzimidazole, 5-nitro-2-mercapto-benimidazole, 5-amino-2-mercapto-benzimidazole, 2-amino-benzimidazole, 5-methyl-benzimidazole, 4,5-diphenyl-benzimidazole, 2-guanadino-benzimidazole, benzothiazole, 2-amino-6-methyl-benzothiazole, 2-mercapto-benzothiazole, 2-methyl-benzothiazole, benzoxazole, 2-mercaptobenzoxazole, 2-mercapto-thiazoline, benzotriazole, 3-amino-1,2,4-triazole, 1H-1,2,4-triazole-3-thiol, 5-amino-1,3,4-thiodiazole-2-thiol, 4-mercapto-1H-pyrazolo[3,4-d]pyrimidine, 4-hydroxy-pyrazolo[3,4-d]pyrimidene, 5-amino-tetrazole monohydrate, tolutriazole, 1-phenyl-3-mercapto-tetrazole, 2-aminothiazole, and thio-benxanilide. Preferred adhesion promoters for use in photoresists and solder masks include benzotriazole, 5-chloro-benzotriazole, 1-chlorobenzotriazole, 1-carboxy-benzotriazole, 1-hydroxybenzotriazole, 2-mercapto-benzoxazole, 1H-1,2, 4-triazole-3-thiol, 5-amino-1,3,4-thiodiazole-2-thiol, and mercapto-benzimidazole.

Other Components

The photopolymerizable compositions may contain other components such as thermal polymerization inhibitors, dyes and pigments, optical brighteners and the like to stabilize, color or otherwise enhance the composition.

Thermal polymerization inhibitors that can be used in the photopolymerizable compositions are: p-methoxyphenol, hydroquinone, and alkyl and aryl-substituted hydroquinones and quinones, tert-butyl catechol, pyrogallol, copper resinate, naphthylamines, diethyl hydroxyl amine, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

Useful optical brighteners include those disclosed in Held U.S. Pat. No. 3,854,950. A preferred optical brightener is 7-(4'-chloro-6'-diethylamino-1',3',5'-triazine-4'-yl) amino 3-phenyl coumarin. Ultraviolet radiation absorbing materials useful in the invention are also disclosed in Held U.S. Pat. No. 3,854,950.

Photoresist Applications

The photopolymerizable compositions of this invention are particularly useful as photoresists for preparing printed circuit boards. In general the use of resists to prepare printed circuits is described in "Printed Circuits Handbook", Second Edition, edited by C. F. Coombs, Jr., published by McGraw-Hill, Inc. in 1979 which includes both screen printed resists as well as photoresists. The use of conventional photoresists for preparing photocircuits is described in "Photoresist-Materials And Processes", by W. S. DeForest, published by McGraw-Hill, Inc. in 1975 which includes negative working photopolymerizable and photocrosslinkable or dimerizable systems as well as positive working photosolubilizable systems. Photoresists may be used in temporary coatings in a primary imaging process to make the printed circuit or they may be used in a secondary imaging process to make permanent coatings, e.g., a solder mask, to protect the circuit during subsequent processing or from environmental effects during use. Permanent coatings also are used as intermediate insulative layers in the manufacture of multilayer printed circuits.

In practice, a photopolymerizable layer, typically between 2.5 and 125 micrometers thick, is applied to a printed circuit substrate which typically is a copper clad fiberglass epoxy board for primary imaging or a printed circuit relief pattern on the board for secondary imaging. The applied photopolymerizable layer is then imagewise exposed to actinic radiation to harden or insolubilize exposed areas. The unexposed areas are then completely removed typically with a developer solution which selectively dissolves, strips or otherwise disperses the unexposed areas without adversely affecting the integrity or adhesion of the exposed areas. The surface areas of the substrate which were uncovered by the development process are then modified by etching or removing material therefrom or depositing a material thereon.

In the instance of primary imaging to form a printed circuit board, the uncovered copper surface areas may be etched or removed to form a printed circuit directly, or additional copper or other metal resistant to etchant, e.g., gold, tin/lead, etc., may be plated thereover. In the first instance, the hardened exposed resist is typically removed from the remaining copper surface by a stripping process to form the circuit board directly. In the second instance, the hardened resist is first stripped from the unplated copper surface which is then etched or removed from the substrate to form a plated printed circuit board.

In the instance when a permanent resist or solder mask is formed on a printed circuit board, the developed solder mask resist image may first be treated to further cure or harden it by baking at elevated temperatures, by additional uniform exposure to actinic radiation or a combination thereof to produce a circuit board having a cured solder mask layer covering all areas except pad or through-hole areas. Electrical components are then inserted into the through-holes or positioned on surface mount areas and soldered in place to form the packaged electrical component. In the instance when a multilayer printed circuit is to be prepared, a permanent resist may be applied to a catalyzed substrate, imaged, developed, and optionally cured to uncover catalyzed areas then typically electrolessly plated to form a first circuit layer. The entire surface of the first circuit layer is then catalyzed and the process is repeated one or more times to form a multilayer printed circuit board.

A particularly preferred embodiment of this invention is a process for forming a solder mask on a printed circuit substrate bearing on its surface, a raised, conductive circuit pattern, the process comprising the steps of (a) applying to the substrate surface bearing the circuit pattern, a photopolymerizable composition to form a photopolymerizable layer thereon, the photopolymerizable composition comprising:
  (1) a composition of matter comprising at least two polymer networks which are polymerized and/or crosslinked in the immediate presence of one another, and are dispersible in a solvent with the proviso that at least one of the polymer networks is formed by polymerization in a solvent and that one of the following takes place in formation of two polymer networks:
    (i) the two polymer networks are formed sequentially wherein the second polymer network is formed in a solvent dispersion of the first formed polymer network, or
    (ii) the two polymer networks are formed simultaneously or substantially simultaneously by independent and non-interfering mechanisms of polymerization, and wherein at least one of the polymer networks contains at least 0.5% by weight of branch or graft linear polymer segments;
  (2) an addition polymerizable monomer containing at least two terminal, ethylenically unsaturated groups; and
  (3) an initiating system activated by actinic radiation;
(b) imagewise exposing the layer to actinic radiation to form exposed and unexposed areas,
(c) removing unexposed areas of the layer to form a stencil solder mask image in the exposed areas and complimentary, unprotected areas of the circuit pattern.

The photopolymerizable composition typically contains a thermally activated crosslinking component and after step (c) the resist areas typically are cured by heating, by uniformly exposing to actinic radiation, by treating with a chemical reagent or by a combination thereof.

Especially preferred for use in permanent coating compositions are polymer products of this invention in which one polymer network comprises a polymer of BA/S/HEMA/EGDMA/Macromer (where the macromer is a BMA/MMA/HEMA/MAA polymer, a BMA/HEMA/MAA polymer or a BMA/MAA polymer, each having a single terminal ethylenic group), and the other polymer network comprises a MMA/MAA/EGDMA polymer. The respective monomer weight ratios in the first network are about 35.2/14/14/1.8/35, the respective ratios in the macromer are about 43/2/30/25, 45/30/25 or 75/25, and the respective ratios in the second polymer network are about 87.2/12/0.8. In the designated polymer product BA is butyl acrylate; BMA is butyl methacrylate; EGDMA is ethylene glycol dimethacrylate; HEMA is 2-hydroxyethyl methacrylate; MAA is methacrylic acid; MMA is methyl methacrylate; and S is styrene.

Resist Application

The photopolymerizable resists may be applied to a printed circuit substrate either as a liquid, as a preformed dry film, or as a combination of a liquid and dry film.

Coating Liquids

The photopolymerizable resist may coated as a liquid onto the printed circuit substrate using any conventional coating process. The liquid may be a dispersion or solution of the resist wherein the solvent is removed subsequent to coating to form a dry, solid, resist layer, or the liquid may be a neat, solvent-free, resist which, subsequent to coating, is directly imaged or exposed to actinic radiation to form a hardened resist layer. The liquids may be roller-coated, spin-coated, screen-coated or printed as disclosed in Coombs supra, in DeForest supra, in Lipson et al. U.S. Pat. No. 4,064,287, or in Oddi et al. U.S. Pat. No. 4,376,815. The liquid, typically as a dispersion or solution, may also be curtain coated as disclosed in Losert et al. U.S. Pat. No. 4,230,793. Neat liquids may be coated and imaged using processes as disclosed in Heiart U.S. Pat. No. 4,548,884, Hauser U.S. Pat. No. B1 4,528,261 or Sullivan, U.S. Pat. Nos. 4,424,089 and 4,591,265.

Dry Film Lamination

A pre-formed, dry-film, photopolymerizable resist layer typically is applied from a multi-ply, transfer, resist element using the lamination process as described in Celeste U.S. Pat. No. 3,469,982. The multi-ply, resist element comprises, in order, an actinic-radiation transparent, temporary support film, e.g., polyethylene terephthalate, a thin photopolymerizable resist layer, and optionally a removable cover sheet, e.g., polyethylene, to protect the resist element during storage. As described in Celeste supra, the cover sheet, if present, is first removed and the uncovered photoresist surface is laminated to the surface of a copperclad printed circuit substrate using heat and/or pressure, e.g., with a conventional hot-roll laminator. Although the laminate is typically imagewise exposed to actinic radiation through the temporary support film, in some instances, where the photoresist layer is insensitive to ambient constituents, like oxygen, the temporary support may be removed before imaging to improve resolution and other such properties. In some instances resist adhesion to the substrate can be improved by treating the substrate surface with a liquid at or just prior to lamination. Typically, the liquid is insensitive to actinic radiation and may be a solution of adhesion promoters as disclosed in Jones U.S. Pat. No. 3,645,772, a solvent or swelling agent for the resist layer as disclosed in Fickes U.S. Pat. No. 4,069,076, a non-solvent, as disclosed in Cohen U.S. Pat. No. 4,405,394 and European Patent 0041639, Pilette et al. U.S. Pat. No. 4,378,264, and Weiner et al. European Patent 0040842, or a liquid component of the resist layer as disclosed in Lau et al., U.S. Pat. No. 4,698,294. The liquid in some instances may be photosensitive such as the photoresist solutions disclosed in Isaacson U.S. Pat. No. 3,629,036, photosensitive liquids as disclosed in O'Neil et al. European Patent Application 87113176.9, or neat photoresist liquids as disclosed in Sullivan U.S. Pat. No. 4,506,004.

In instances when a dry film, e.g., solder mask, is to be laminated to a substrate having a low relief like a circuit board, measures must be taken to eliminate entrapped air, e.g., from around circuit lines. Entrapped air is eliminated by the vacuum lamination process of Friel U.S. Pat. No. 4,127,436, by the grooved roll lamination process of Collier et al., U.S. Pat. No. 4,071,367, or by using liquid treating agents as described in Fickes supra, Lau et al. supra, O'Neil et al. supra or Sullivan '004 supra.

To further illustrate the present invention the following examples are provided, wherein the amounts of components are given in parts by weight unless otherwise designated.

EXAMPLE 1

Macromer Solution (1) to be used in subsequent polymer product formation, is prepared using the following procedures:

To a clean reaction vessel were added:

|  | Amount |
| --- | --- |
| Methacrylic acid (MAA) | 3.31 |
| Hydroxyethyl methacrylate (HEMA) | 7.93 |
| Butyl methacrylate (BMA) | 11.89 |
| Methyl ethyl ketone | 15.50 |

The resulting solution was heated to reflux temperature and held there, with stirring. The following solution, previously mixed for 15 minutes under nitrogen was then rapidly added:

|  | Amount |
| --- | --- |
| Methyl ethyl ketone | 1.56 |
| Bis(difluoroboryl) diphenyl gloximato cobalt II hydrate (SCT) | 0.004 |
| Vazo ® 52 catalyst 2,2'-azobis (2,4-dimethylpentane nitrile) | 0.023 |

The following solutions, previously mixed for 15 minutes under nitrogen, were then simultaneously added to the reaction vessel:

| Solution (A) | Amount |
| --- | --- |
| Methyl ethyl ketone | 8.79 |
| SCT | 0.007 |
| Vazo ® 52 | 0.252 |

| Solution (B) | Amount |
| --- | --- |
| Methacrylic acid (MAA) | 7.68 |
| Hydroxyethyl methacrylate (HEMA) | 5.29 |
| Butyl methacrylate (BMA) | 7.93 |
| Methyl ethyl ketone | 0.55 |

Solution (A) was fed so that 54.8% was added over a 90-minute period and 45.2% over a 240-minute period; solution (B) was fed so that 67% was added over a 120-minute period and 33% over a 240-minute period.

The reaction mass was held at reflux temperature, with stirring, for 45 minutes, and then 6.9 parts of methyl ethyl ketone were added. The mass was then held for another 30 minutes at reflux temperature, cooled to 50° C. and filtered to give Macromer solution (1).

Polymer Product (A) of this invention was prepared using the following procedures:

To a reaction vessel were added:

|  | Amount |
| --- | --- |
| Macromer solution (1) | 21.79 |
| Butyl acrylate (BA) | 16.41 |
| Styrene (S) | 6.55 |
| Hydroxyethyl methacrylate (HEMA) | 6.55 |
| Ethylene glycol dimethacrylate (EGDMA) | 1.05 |
| Methyl ethyl ketone | 9.91 |

This reaction mass was heated to reflux temperature and held there, with stirring, while there was added, over a 5-minute period, a solution of:

|  | Amount |
| --- | --- |
| Methyl ethyl ketone | 2.18 |
| Vazo ® 67 (2,2'-azobis(2-methylpentane nitrile) | 1.31 |

The reaction mass was then held at reflux temperature, with stirring, for 120 minutes.

The following solution was then added to the reaction mass:

|  | Amount |
| --- | --- |
| Methyl ethyl ketone | 1.31 |
| Vazo ® 67 | 0.22 |

The reaction mass was then held at reflux temperature, with stirring, for 120 minutes.

The following solution was then added:

|  | Amount |
| --- | --- |
| Methyl ethyl ketone | 0.87 |
| Vazo ® 67 | 0.22 |

The reaction mass was then held at reflux temperature, with stirring, for 120 minutes.

The following solution was then added:

|  | Amount |
| --- | --- |
| Ethylene glycol dimethacrylate (EGDMA) | 0.039 |
| Methacrylic acid | 0.582 |
| Methyl methacrylate | 4.23 |
| Methyl ethyl ketone | 8.26 | followed by a solution containing:

|  | Amount |
| --- | --- |
| Methyl ethyl ketone | 0.34 |
| Vazo ® 67 | 0.17 |

The reaction mass was again held at reflux temperature for 120 minutes, with stirring, and then the following solution was added:

| | Amount |
|---|---|
| Methyl ethyl ketone | 0.146 |
| Vazo ® 34 | 0.024 |

The mass was then held at reflux temperature, with stirring, for 240 minutes, to give a polymer product, Polymer Product (A), in which one polymer network is BA/S/HEMA/EGDMA/Macromer (1)

37.7/15/15/2.3/30 where Macromer (1) is

BMA/HEMA/MAA

45/30/25 and the other polymer network is

MMA/MAA/EGDMA 87.2/12/0.8

This product was formed into pellets by drying it in an extrusion devolatilizer.

EXAMPLE 2

A dry-film, photosensitive solder mask element was prepared as follows:

| Solder Mask Composition | Amount |
|---|---|
| Pentaerythritol triacrylate | 450.0 |
| Trimethylol propane triacrylate | 450.0 |
| Homopolymer of hexamethylene diisocyanate blocked with methyl ethyl ketoxime (Desmodur ® BL-3175A) (75% solids) | 817.8 |
| Diethyl hydroxylamine | 1.5 |
| Benzophenone | 120.0 |
| Michler's ketone | 3.0 |
| 3-mercapto-1H-1,2,4-triazole | 6.0 |
| Green colorant (Dayglo ® 122-9655) | 90.0 |
| Polymer product (A) of Example 1 | 1264.5 |
| Amphoteric copolymer formed from 40% N-t-octyl acrylamide, 34% methyl methacrylate, 16% acrylic acid, 6% hydroxypropyl methacrylate and 4% t-butyl aminoethyl methacrylate; mol. wt. ca. 50,000 | 60.0 |
| PVP K-90 (polyvinyl pyrrolidone) | 180.0 |

The composition was dispersed or dissolved for coating in 9106 parts by weight of solvent comprising 90% methylene chloride and 10% methanol. This solution was then coated on Mylar®92D polyethylene terephthalate film (E. I. du Pont de Nemours and Company) and air-dried at 150° F. to give a dry photosensitive layer 2 mils thick. This layer was top-laminated with matte, 1 mil polyethylene film with the smooth side to the coating, to give a dry-film, photosensitive, solder mask element.

A series of printed circuit board panels of a size 12"×18" containing a raised relief height of about 3.5 mils on both panel surfaces with approximately 1200 holes ranging in size from 17 mils to 35 mils diameter was coated with tripropyleneglycol diacrylate (having a viscosity of 14.5 centipoise at 25° C.) via a wetting sponge.

The monomer wet panels while held in a vertical position were passed in a horizontal direction through a nip of two rolls while the dry photosensitive layer was laminated onto the wet panels after first removing the polyethylene film therefrom. The temperature of the rolls was about 140° F. with nip pressure of about 35 psi controlled by air cylinders. Each roll was of a type employed in a VALU™ System lamination and contained a Teflon® polytetrafluoroethylene sleeve covering a normal rubber coating.

In the lamination procedure the monomer of liquid coating was present in a thickness of about 0.2 mils measured away from the raised relief of the panel with the coating ranging to about 3.5 mils immediately adjacent the raised relief and approximately 0.2 mils above the raised relief.

The panel edges were trimmed and residual monomer liquid was removed by a spray of water.

The panels were held for 30 minutes after lamination and then given an exposure of 350 millijoules/cm$^2$ to ultraviolet light on Du Pont's PC-130 exposure unit. After exposure the Mylar® polyethylene terephthalate film was removed and the sample was developed in an ADS processor with a 1% aqueous sodium carbonate solution at 105° F. Development time was about 284 seconds. After development, each side of each board was cured in an Argus UV unit, first for an exposure of 2 joules/cm$^2$, then cooling the board, then for an exposure of 6 joules/cm$^2$. The boards were then baked for one hour at 150° C. The resulting solder mask permanently adhered to each printed circuit board is a triple interpenetrating polymer network substantially filling the dimensions of the solder mask image.

The boards gave successful results as a solder mask when evaluated in a typical manner for solder mask properties including tests for solder resistance, solvent resistance, electrical properties, adhesion, thermal shock resistance and flammability. Testing followed the standard specification procedure recommended by the Institute for Interconnecting and Packaging Electronic Circuits present in their publication IPC-SM-840.

EXAMPLE 3

A Macromer solution (2) was prepared similarly to the preparation of Macromer solution (1) of Example 1, except that the Macromer composition was changed from BMA/HEMA/MMA (45/30/25) for Macromer solution (1) to BMA/MMA/HEMA/MMA (43/2/30/25) for Macromer solution (2).

A Polymer Product (B) was prepared similarly to the preparation of Polymer Product (A) of Example 1, except that the polymer composition was changed from BA/S/HEMA/EGDMA/Macromer (1):(37.7/15/15/2.3/30) for the first polymer network to BA/S/HEMA/EGDMA/Macromer (2): (35.2/14/14/1.8/35). The composition of the other polymer network remained the same as in Example 1, i.e., MMA/MAA/EGDMA:(87.2/12/0.8).

EXAMPLE 4

A dry-film, photosensitive solder mask element was prepared as follows:

| Solder Mask Compostion | Amount |
|---|---|
| Pentaerythritol triacrylate | 168.4 |
| Trimethylol propane triacrylate | 168.4 |
| Homopolymer of hexamethylene diisocyanate blocked with methyl ethyl ketoxime (Desmodur ® BL-3175A) (75% solids) | 131.5 |
| Diethyl hydroxylamine | 0.53 |
| Benzophenone | 36.8 |
| Ethyl Michler's ketone | 1.9 |
| 3-mercapto-1H-1,2,4-triazole | 1.9 |
| Green colorant (Dayglo ® 122-9655) | 5.3 |
| Green colorant (Dayglo ® 122-9693) | 31.5 |
| Polymer Product (B) of Example 3 | 477.4 |
| Amphoteric copolymer formed from 40% N-t-octyl acrylamide, 34% methyl | 28.9 |

-continued

| Solder Mask Compostion | Amount |
|---|---|
| methacrylate, 16% acrylic acid, 6% hydroxypropyl methacrylate and 4% t-butyl aminoethyl methacrylate; mol. wt. ca. 50,000 | |
| PVP K-90 (polyvinyl pyrrolidone) | 31.5 |

The composition was dispersed or dissolved for coating at 25% by weight in solvent comprising 92% methylene chloride and 8% methanol. This solution was then coated on Mylar®92D polyethylene terephthalate film (E. I. du Pont de Nemours and Company) and air-dried at 150° F. to give a dry photosensitive layer 2 mils thick. This layer was top-laminated with matte, 1 mil polyethylene film with the smooth side to the coating, to give a dry-film, photosensitive, solder mask element.

The dry-film, photosensitive solder mask was applied to a series of printed circuit board panels, processed and evaluated similarly to that described in Example 2.

The boards gave successful results as a solder mask when evaluated in the typical manner for solder mask properties as set forth in Example 2.

EXAMPLE 5

Polymer Product (C) of this invention was prepared using the following procedures:

To a reaction vessel were added:

| | Amount |
|---|---|
| Acrylic acid (AA) | 15.0 |
| Butyl acrylate (BA) | 61.7 |
| Styrene (S) | 15.0 |
| Hydroxyethyl methacrylate (HEMA) | 7.0 |
| Ethylene glycol dimethacrylate (EGDMA) | 1.3 |
| Methyl ethyl ketone | 71.5 |

This reaction mass was heated to reflux temperature and held there, with stirring, while there was added, over a 5-minute period, a solution of:

| | Amount |
|---|---|
| Methyl ethyl ketone | 7.0 |
| Vazo ® 67 (2,2'-azobis (2-3.5 methylpentane nitrile) | 3.5 |

The reaction mass was then held at reflux temperature, with stirring for 120 minutes.

The following solution was then added to the reaction mass:

| | Amount |
|---|---|
| Methyl ethyl ketone | 3.0 |
| Vazo ®67 | 0.5 |

The reaction mass was then held at reflux temperature, with stirring, for 240 minutes.

To 148.4 parts of the above solution the following solution was then added:

| | Amount |
|---|---|
| Ethylene glycol dimethacrylate (EGDMA) | 0.12 |
| Methacrylic acid | 2.4 |
| Ethyl methacrylate | 17.5 |
| Methyl ethyl ketone | 14.3 | followed by a solution containing:

| | Amount |
|---|---|
| Methyl ethyl ketone | 1.4 |
| Vazo ®67 | 0.07 |

The reaction mass was again held at reflux temperature for 120 minutes, with stirring, and then the following solution was added:

| | Amount |
|---|---|
| Methyl ethyl ketone | 0.60 |
| Vazo ®67 | 0.10 |

The mass was then held at reflux temperature, with stirring, for 240 minutes, to give a polymer product, Polymer Product (C), in which one polymer network is

BA/S/HEMA/EGDMA/AA 61.7/15/7/1.3/15 and the other polymer network is

EMA/MAA/EGDMA 87.4/12/0.6.

This product was used in solution as prepared (55% solids).

EXAMPLE 6

A dry-film, photosensitive solder mask element was prepared as follows:

| Solder Mask Composition | Amount |
|---|---|
| Pentaerythritol triacrylate | 12.8 |
| Trimethylol propane triacrylate | 12.8 |
| Homopolymer of hexamethylene diisocyanate blocked with methyl ethyl ketoxime (Desmodur ®BL-3175A) (75% solids) | 23.2 |
| Diethyl hydroxylamine | 0.04 |
| Benzophenone | 3.4 |
| Ethyl Michler's ketone | 0.03 |
| Ethyl p-dimethylamino benzoate | 1.5 |
| 3-mercapto-1H-1,2,4-triazole | 0.17 |
| Green colorant (HVT-45) | 2.6 |
| Polymer Product (C) of Example 5 (55% solids) | 67.1 |
| Cyprubond ® talc filler | 15.0 |
| Amphoteric copolymer formed from 40% N-t-octyl acrylamide, 34% methyl methacrylate, 16% acrylic acid, 6% hydroxypropyl methacrylate and 4% t-butyl aminoethyl methacrylate; mol. wt. ca. 50,000 | 1.7 |
| PVP K-90 (polyvinyl pyrrolidone) | 2.6 |

The composition was dispersed or dissolved for coating at 35% by weight in solvent comprising 92% methylene chloride and 8% methanol, and ball milled overnight. (The filler and Polymer Product (C) were ball milled in solvent first before adding the other ingredients.) This solution was then coated on Mylar®92D polyethylene terephthalate film (E. I. du Pont de Nemours and Company) and air-dried at 150° F. to give a dry photosensitive layer 3.3 mils thick. This layer was top-laminated with matte, 1 mil polyethylene film with the smooth side to the coating, to give a dry-film, photosensitive, solder mask element.

A series of printed circuit board panels of a size 6"×6" containing a raised relief height of about 3.5 mils on both panel surfaces with approximately 200 holes ranging in size from 17 mils to 35 mils diameter were conventionally vacuum laminated with the dry-film, photosensitive solder mask element, so that the temperature of each board panel exiting the vacuum laminator was about 150° F.

The boards gave successful results as a solder mask when evaluated in the typical manner for solder mask properties as set forth in Example 2.

EXAMPLE 7

Sequential Preparation of a PEU-Acrylic Catenated System:

(1) To a reaction vessel were charged.

| Neopentyl glycol | 1439.25 parts |
|---|---|
| Isophthalic acid | 883.00 |
| Adipic Acid | 338.41 |
| Dodecanedioc acid | 612.05 |

This mixture was heated to 155–165° C. and held there, with stirring. Water removal was then begun and the temperature of the mixture was allowed to rise to about 260° C. When the temperature of the effluent vapor dropped to about 90° C. and the acid number was about 3, the reaction was stopped.

(2) A mixture was prepared of

| Product of (1) | 738.51 parts |
|---|---|
| Ethyl acetate | 574.80 |
| Dibutyltin dilaurate | 0.90 |

This was charged to a reaction vessel, heated to reflux temperature and held there. To it was then added, with stirring over a 45 minute period, a mixture of

| Desmodur ® W (difunctional isocyanate) | 144.02 parts |
|---|---|
| Desmodur ®N (trifunctional isocyanate, 75% solids in ethyl acetate) | 41.177 |

The resulting mixture was held at reflux temperature for six hours and then cooled.

(3) To a reaction vessel were added 365.62 parts of (2) and a mixture of

| Methyl methacrylate | 59.8 parts |
|---|---|
| Styrene | 19.8 |
| Butyl methacrylate | 23.15 |
| Glycidyl methacrylate | 11.58 |
| 1,6-hexanediol diacrylate | 1.39 |
| Methyl ethyl ketone | 82.96 |

This mixture was heated to reflux temperature and held there with stirring. To it was then added a mixture of

| Vazo ® 67 [2,2'-azobis-(2-methyl butyronitrile) | 4.05 parts |
|---|---|
| Methyl ethyl ketone | 7.93 |

The resulting mixture was held at reflux for 2 hours, and to it was then added a mixture of

| Vazo ®67 | 0.57 parts |
|---|---|
| Methyl ethyl ketone | 3.41 |

This was held for four hours at reflux temperature, with stirring, 84.8 parts of a 1/1 mixture of aromatic hydrocarbon (Solvesso® 100) and dimethyl esters of mixed $C_9$–$C_{12}$ dibasic acids were added, and the mixture cooled.

The resulting dispersion was stable after eight months of storage. A film of the dispersion drawn on a glass plate was smooth, glossy and transparent.

EXAMPLE 8

Concurrent Preparation of an Epon/S/EA/MAA-S/Unsaturated PE Catenated System:

(1) To a reaction vessel were charged

| Trimethylol propane | 363.42 parts |
|---|---|
| Ethylene glycol | 840.44 |
| Terephthalic acid | 449.94 |
| Isophthalic acid | 674.84 |
| Adipic acid | 840.98 |
| Maleic anhydride | 99.52 |

This mixture was heated to 150–160° C., under nitrogen, with stirring. Water removal was then begun and the temperature of the mixture was allowed to rise to 260–270° C. This temperature was maintained until the reaction mixture had an acid number of 1 or less. The mixture was then cooled and to it was added a mixture of

| Butanol | 350.00 parts |
|---|---|
| Ethylene glycol monobutyl ether | 350.00 |

To a reaction vessel were charged

| Butyl Cellosolve ® acetate | 685.5 parts |
|---|---|
| Butanol | 243.6 |
| Ethyl acetate | 174.5 |
| t-Butyl perbenzoate | 0.2 |

This mixture was heated to reflux temperature, under nitrogen, and held there with stirring. To it was then added, over a 2-hour period, a mixture of

| Ethyl acrylate | 662.5 parts |
|---|---|
| Methacrylic acid | 303.0 |
| Styrene | 839.0 |
| Butanol | 15.4 |
| t-Butyl perbenzoate | 17.7 |

Butanol, 58.6 parts, was added to the mixture, which was then held at reflux temperature for two hours and cooled.

(3) To a reaction vessel were charged

| | |
|---|---|
| Product of (1) | 23.98 parts |
| Product of (2) | 133.97 |
| Cellosolve ® acetate | 157.42 |
| Methyl ethyl ketone | 9.40 |

To this was added, with stirring a mixture of

| | |
|---|---|
| Styrene | 363.43 parts |
| Epon ® 1004 (65% solids in methyl ethyl ketone) | 11.51 |

The mixture was heated to reflux, with stirring, and to it was added a solution of

| | |
|---|---|
| Trimethylbenzyl ammonium hydroxide (40% solids in methanol) | 0.19 parts |
| Cellosolve ® acetate | 4.32 |
| and a solution of | |
| (a) Di-t-butyl peroxide | 2.88 parts |
| Cellosolve ® acetate | 3.16 |

The reaction mixture was then held at reflux while two additional portions of solution (a) were added at two hour intervals.

The mixture was then cooled and brought to a solids content of 25% with Cellosolve® acetate. The resulting transparent dispersion was stable after 3 years of storage. A film of the dispersion drawn on a glass plate was glossy and smooth, with a blue-white transparent haze.

EXAMPLE 9

Sequential Preparation of a S/BA/HEMA/DEAM/EGDMA-VP/HEMA/EGDMA Catenated System:

(1) A mixture was prepared of

| | |
|---|---|
| Styrene | 450.0 parts |
| Diethylaminoethyl methacrylate | 75.0 |
| Butyl acrylate | 723.0 |
| Hydroxyethyl methacrylate | 225.0 |
| Ethylene glycol dimethacrylate | 27.0 |
| Isopropanol | 1252.2 |

This mixture was charged to a reaction vessel, heated to reflux temperature and held there, and to it was then added, over a 5-minute period, a mixture of

| | |
|---|---|
| Vazo ® 67 | 56.7 parts |
| Isopropanol | 129.0 |
| Methyl ethyl ketone | 70.0 |

This mixture was heated at reflux temperature, with stirring, for two hours. To it was then added a solution of

| | |
|---|---|
| Vazo ® 67 | 8.1 parts |
| Methyl ethyl ketone | 54.0 |

The mixture was then heated at reflux temperature for two hours and then cooled.

(2) A reaction vessel was charged with

| | |
|---|---|
| Product of (1) | 1500.0 parts |
| 4-vinylpyridine | 169.0 |
| Hydroxyethyl methacrylate | 19.2 |
| Ethylene glycol dimethacrylate | 5.0 |

This mixture was heated to reflux temperature, held there for five minutes, and to it was added, over a 5-minute period, a mixture of

| | |
|---|---|
| Vazo ® 67 | 57.7 parts |
| Isopropanol | 129.0 |
| Methyl ethyl ketone | 70.0 |

This was then heated at reflux temperature, under nitrogen, with stirring, for two hours. To it was then added a mixture of

| | |
|---|---|
| Vazo ® 67 | 8.1 parts |
| Methyl ethyl ketone | 54.0 |

This reaction mixture was then held at reflux temperature for two hours and cooled.

The resulting reddish dispersion was transparent and stable after storage for two months. A film of the dispersion drawn on a glass plate was transparent and glossy, with a slight blue haze.

EXAMPLE 10

Sequential Preparation of a PEU Network-PVP Network Catenated System:

To a reaction vessel were charged

| | |
|---|---|
| Polyesterurethane resin prepared as in Example 7 (2) | 265.22 parts |
| 1-Vinyl-2-pyrrolidone | 29.84 |
| 1,6 Hexanediol diacrylate | 0.40 |

This mixture was heated at reflux temperature, under nitrogen, for five minutes. To it was then added, over a five-minute period, a mixture of

| | |
|---|---|
| Vazo ® 67 | 1.24 parts |
| Methyl ethyl ketone | 2.47 |

The mixture was then held at reflux temperature for two hours, and to it was added a mixture of

| | |
|---|---|
| Vazo ® 67 | 0.18 parts |
| Methyl ethyl ketone | 1.06 |

Refluxing of the mixture was continued for four hours, and to it was then added 94.6 parts of a 1/1 mixture of aromatic hydrocarbon (Solvesso® 100) and dimethyl esters of mixed $C_9$–$C_{12}$ dibasic acids.

The resulting transparent dispersion was stable after 6 months of storage. A film of the dispersion drawn on glass was transparent and glossy.

EXAMPLE 11

Sequential Preparation of a S/BA/EGDMA/HEMA-MMA/EGDMA/HEMA Catenated System:

(A) To a reaction vessel were charged

| | |
|---|---|
| Butyl acrylate | 710.49 parts |
| Styrene | 145.59 |
| Hydroxyethyl methacrylate | 97.06 |
| Ethylene glycol dimethacrylate | 17.47 |
| Methyl ethyl ketone | 693.50 |

This mixture was heated to reflux temperature, under nitrogen, with stirring, and to it was added, over a five-minute period, a mixture of

| | |
|---|---|
| Vazo ® 67 | 33.97 parts |
| Methyl ethyl ketone | 67.94 |

The reaction mixture was held at reflux temperature, with stirring, for two hours. To it was then added a mixture of

| | |
|---|---|
| Vazo ® 67 | 4.85 parts |
| Methyl ethyl ketone | 29.12 |

The mixture was then held at reflux temperature with stirring for four hours, and then cooled.

(B) To a reaction vessel were charged

| | |
|---|---|
| Product of (A) | 120.54 parts |
| Methyl methacrylate | 31.08 |
| Hydroxyethyl methacrylate | 3.50 |
| Ethylene glycol dimethacrylate | 0.42 |
| Methyl ethyl ketone | 25.00 |

This mixture was heated to reflux temperature, under nitrogen, with stirring, and to it was added, over a 5-minute period, a mixture of

| | |
|---|---|
| Vazo ® 67 | 1.23 parts |
| Methyl ethyl ketone | 2.45 |

This was held at reflux temperature for two hours, with stirring. To it was then added a mixture of

| | |
|---|---|
| Vazo ® 67 | 0.18 parts |
| Methyl ethyl ketone | 1.05 |

This final reaction mixture was then held at reflux temperature, with stirring, for four hours.

The resulting translucent dispersion was stable. A film of the dispersion drawn on a glass plate was clear, transparent, glossy and smooth.

Polymer networks numbered 2, 3 and 4 in the illustrative list of networks which can be used to make the dispersions of the invention can be made according to the general method of this example by using appropriate monomers in the proper proportions.

EXAMPLE 12

Sequential Preparation of a Polyester Network-Acrylic Network Catenated System:

(A) Into a reaction vessel were charged

| | |
|---|---|
| Neopentyl glycol | 340.0 parts |
| Trimethylol propane | 90.0 |
| Isophthalic acid | 22.0 |
| Adipic acid | 147.0 |
| Azelaic acid | 190.0 |
| Xylene | 80.0 |

This mixture was heated to reflux temperature, with stirring, under nitrogen, for ten hours, and water was taken off to an acid number of 16. it was then cooled to 80° C. and to it were added, over a 15-minute period, 250 parts of xylene and 100 parts of methyl ethyl ketone.

(B) To a reaction vessel were charged

| | |
|---|---|
| Product of (A) | 250.0 parts |
| Ethyl acetate | 129.5 |
| Methyl methacrylate | 86.3 |
| Hexanediol diacrylate | 0.88 |
| Vazo ® 67 | 1.73 |

This mixture was heated to reflux temperature, under nitrogen, with stirring, and held there for 5 hours. It was then cooled.

The resulting homogeneous translucent dispersion was stable after four months of storage. A film of the dispersion drawn on glass was uniform and glossy.

EXAMPLE 13

Sequential Preparation of a PEU Network-PVac Network Catenated System

To a reaction vessel were charged

| | |
|---|---|
| Polyesterurethane resin prepared as in Example 7(2) | 265.22 parts |
| Vinyl acetate | 29.84 |
| 1,6-hexanediol diacrylate | 0.40 |

This mixture was heated at reflux temperature, under nitrogen, for five minutes. To it was then added, over a five-minute period, a mixture of

| | |
|---|---|
| Vazo ® 67 | 1.24 parts |
| Methyl ethyl ketone | 2.47 |

This mixture was heated at reflux temperature, under nitrogen, for five minutes. To it was then added, over a five-minute period, a mixture of

| | |
|---|---|
| Vazo ® 67 | 0.18 parts |
| Methyl ethyl ketone | 1.06 |

Refluxing of the mixture was continued for four hours, and to it was then added 94.6 parts of a 1/1 mixture of aromatic hydrocarbon (Solvesso® 100) and dimethyl esters of mixed C9–C12 dibasic acids.

The resulting translucent dispersion was stable after a storage period of three months. A film of the dispersion drawn on glass was smooth and glossy, with a slight blue haze.

What is claimed is:

1. A composition of matter comprising at least two polymer networks which
   (a) are polymerized and/or crosslinked in the immediate presence of one another, and
   (b) are dispersible in a solvent with the proviso that at least one of the polymer networks is formed by polymerization in a solvent and that one of the following takes place in formation of two polymer networks:
      (i) the two polymer networks are formed sequentially wherein the second polymer network is formed in a solvent dispersion of the first formed polymer network, or
      (ii) the two polymer networks are formed simultaneously or substantially simultaneously by independent and non-interfering mechanisms of polymerization; and
   (c) wherein at least one of the polymer networks contains at least 0.5% by weight of branch or graft linear polymer segments.

2. The composition of claim 1 wherein the branch linear polymer segments are formed during the formation of the polymer network from at least one macromer.

3. The composition of claim 2 wherein the macromer is a linear polymer precursor having a terminal polymerizable ethylenic group.

4. The composition of claim 1 wherein the linear polymer segment contains between 2 and 1000 monomeric units.

5. The composition of claim 1 wherein the linear polymer segment has a weight average molecular weight between about 250 and about 10,000.

6. The composition of claim 1 wherein each polymer network has a gel point and wherein polymerization of at least one polymer network is terminated before, substantially at, or near the gel point of the polymer network.

7. The composition of claim 1 wherein at least one solvent dispersible polymer network is a sol, a critical gel or a combination thereof.

8. The composition of claim 1 wherein at least one of the polymer networks, linear polymer segments or linear or branched polymers bears one or more functional group wherein the functional group is —COOR; —OR; —SR (where R can be hydrogen, alkyl or cycloalkyl of 1–18 carbon atoms, aryl, alkaryl or aralkyl, a heterocyclic, or —OR$_1$ where R$_1$ can be alkyl of 1–18 carbon atoms, aryl, alkaryl or aralkyl); —CN; halogen;

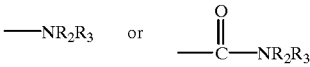

(where R$_2$ and R$_3$ can be hydrogen, alkyl or cycloalkyl of 1–18 carbon atoms, aryl, alkaryl, aralkyl, —CH$_2$OR$_4$ (where R$_4$ is hydrogen, alkyl or cycloalkyl of 1–18 carbon atoms, aryl, alkaryl, aralkyl), or together R$_2$ and R$_3$ can form a heterocyclic ring);

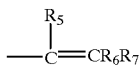

(where R$_5$, R$_6$ and R$_7$ can be hydrogen, alkyl or cycloalkyl of 1–18 carbon atoms, aryl, alkaryl, aralkyl,

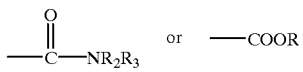

or when taken together R$_5$, R$_6$ and/or R$_7$ can form a cyclic or heterocyclic group); —SO$_3$H; a urethane group; an isocyanate or blocked isocyanate group; a urea group; an oxirane group; an aziridine group; a quinone diazide group; an azo group; an azide group; a diazonium group; an acetylacetoxy group; —SiR$_8$R$_9$R$_{10}$ (where R$_8$, R$_9$ and R$_{10}$ can be alkyl or cycloalkyl of 1–18 carbon atoms or —OR$_{11}$ where R$_{11}$ is alkyl or cycloalkyl of 1–18 carbon atoms, aryl, alkaryl or aralkyl); or an —OSO$_3$R$_{12}$, —OPO$_2$R$_{12}$, —PO$_2$R$_{12}$, —PR$_{12}$R$_{13}$R$_{14}$, —OPOR$_{12}$, —SR$_{12}$R$_{13}$, or —N$^+$R$_{12}$R$_{13}$R$_{14}$ group (where R$_{12}$, R$_{13}$ and R$_{14}$ can be hydrogen, alkyl or cycloalkyl of 1–18 carbon atoms, aryl, alkaryl or aralkyl); or a salt or onium salt of any of the foregoing.

* * * * *